(12) United States Patent
Kim et al.

(10) Patent No.: US 11,482,173 B2
(45) Date of Patent: Oct. 25, 2022

(54) DISPLAY DEVICE

(71) Applicant: Samsung Display Co., Ltd., Yongin-Si (KR)

(72) Inventors: Ki Wook Kim, Hwaseong-si (KR); Kwang Min Kim, Seoul (KR); Yang Wan Kim, Hwaseong-si (KR); Ji Su Na, Yongin-si (KR); Min Woo Byun, Seongnam-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/541,314

(22) Filed: Dec. 3, 2021

(65) Prior Publication Data
US 2022/0093043 A1 Mar. 24, 2022

Related U.S. Application Data
(63) Continuation of application No. 17/183,403, filed on Feb. 24, 2021, now Pat. No. 11,195,462, which is a
(Continued)

(30) Foreign Application Priority Data
Jul. 2, 2018 (KR) .................. 10-2018-0076362

(51) Int. Cl.
*G09G 3/32* (2016.01)
*G09G 3/3233* (2016.01)
(Continued)

(52) U.S. Cl.
CPC ....... *G09G 3/3233* (2013.01); *H01L 27/3218* (2013.01); *H01L 27/3248* (2013.01);
(Continued)

(58) Field of Classification Search
CPC .. G09G 3/3233; G09G 3/3208; G09G 3/3266; G09G 3/3275; G09G 2300/0426;
(Continued)

(56) References Cited

U.S. PATENT DOCUMENTS 9,721,502 B2    8/2017  Bi et al.
10,950,174 B2*  3/2021  Kim .................... G09G 3/3233
(Continued)

FOREIGN PATENT DOCUMENTS

EP      3331019 A1     6/2018
WO      2018099073 A1  6/2018

OTHER PUBLICATIONS

European Communication corresponding to European Patent Application No. 19183963.8 dated Nov. 11, 2019 6 pages.

*Primary Examiner* — Adam J Snyder
(74) *Attorney, Agent, or Firm* — Innovation Counsel LLP

(57) ABSTRACT

Provided are a display device. The display device comprises: a display unit defined by a display area and a non-display area located outside the display area, and including pixels arranged in the display area, first sensing wirings electrically connected to the pixels, and auxiliary voltage wirings electrically separated from the pixels; and a sensing unit electrically connected to the first sensing wirings, wherein the first sensing wirings and the auxiliary voltage wirings extend in a first direction and are sequentially arranged along a second direction perpendicular to the first direction at first intervals, the first sensing wirings are spaced apart from each other along the second direction at second intervals greater than the first intervals and are electrically separated from each other, and the auxiliary voltage wirings are electrically connected to each other.

20 Claims, 21 Drawing Sheets

Related U.S. Application Data continuation of application No. 16/373,312, filed on Apr. 2, 2019, now Pat. No. 10,950,174.

(51) Int. Cl.
  *H01L 27/32* (2006.01)
  *H01L 27/12* (2006.01)
  *G09G 3/3208* (2016.01)
  *G09G 3/3266* (2016.01)
  *G09G 3/3275* (2016.01)

(52) U.S. Cl.
  CPC ...... *H01L 27/3258* (2013.01); *H01L 27/3262* (2013.01); *H01L 27/3276* (2013.01); *G09G 3/3208* (2013.01); *G09G 3/3266* (2013.01); *G09G 3/3275* (2013.01); *G09G 2300/0426* (2013.01); *G09G 2320/045* (2013.01); *G09G 2330/12* (2013.01); *H01L 27/124* (2013.01); *H01L 27/1222* (2013.01); *H01L 27/1225* (2013.01); *H01L 27/1248* (2013.01)

(58) Field of Classification Search
  CPC .......... G09G 2320/045; G09G 2330/12; H01L 27/1222; H01L 27/1225; H01L 27/124; H01L 27/1248; H01L 27/3218; H01L 27/3248; H01L 27/3258; H01L 27/3262; H01L 27/3276

See application file for complete search history.

(56) References Cited

U.S. PATENT DOCUMENTS

| | | |
|---|---|---|
| 11,195,462 B2 * | 12/2021 | Kim ..................... G09G 3/3233 |
| 2015/0084946 A1 | 3/2015 | Shim et al. |
| 2015/0130785 A1 | 5/2015 | Shin et al. |
| 2015/0325174 A1 | 11/2015 | Yu et al. |
| 2016/0098960 A1 | 4/2016 | Park |
| 2017/0193881 A1 | 7/2017 | Kim et al. |
| 2017/0329443 A1 | 11/2017 | Wang et al. |
| 2018/0061908 A1 | 3/2018 | Shim et al. |
| 2018/0120995 A1 | 5/2018 | Lee et al. |
| 2018/0247587 A1 | 8/2018 | Kimura |
| 2018/0357964 A1 | 12/2018 | Shin et al. |
| 2019/0155430 A1 | 5/2019 | Hwang et al. |
| 2020/0005709 A1 * | 1/2020 | Kim ..................... G09G 3/3233 |
| 2021/0201785 A1 * | 7/2021 | Kim ..................... G09G 3/3233 |
| 2022/0093043 A1 * | 3/2022 | Kim ..................... G09G 3/3233 |

* cited by examiner

DISPLAY DEVICE

CROSS-REFERENCE TO RELATED APPLICATION(S)

This application is a continuation application of U.S. patent application Ser. No. 17/183,403 filed on Feb. 24, 2021, which is a continuation application of U.S. patent application Ser. No. 16/373,312 filed on Apr. 2, 2019 (now U.S. Pat. No. 10,950,174), which claims priority to and the benefit of Korean Patent Application No. 10-2018-0076362 filed on Jul. 2, 2018, in the Korean Intellectual Property Office, the disclosures of which are incorporated herein in their entirety by reference.

BACKGROUND

1. Field of the Invention

The present inventive concept relates to a display device, and more particularly, to an organic light emitting display device compensating for deterioration of a pixel and a change in characteristics of a driving transistor using an external compensation technology.

2. Description of the Related Art

An organic light emitting display device displays an image using an organic light emitting diode that emits light by recombination of electrons and holes. The organic light emitting display device includes pixels, and each of the pixel includes an organic light emitting diode and a driving transistor providing a current to the organic light emitting diode.

The organic light emitting diode may be deteriorated by usage, and the characteristics (for example, threshold voltage/mobility) of the driving transistor included in each of the pixels may not be uniform. Thus, compensation technologies of compensating a data signal applied to a pixel by measuring the characteristics of a transistor have been developed, and the compensation technologies may be classified as external compensation technologies or internal compensation technologies depending on whether a circuit for measuring the characteristics of a transistor or compensating the characteristics thereof is provided outside or inside another transistor.

A characteristic difference may occur between a pixel adjacent to a sensing wiring for external compensation of a pixel and a pixel spaced apart from the sensing wiring.

SUMMARY

Aspects of the present inventive concept provide a display device in which a difference in characteristics between pixels due to a sensing wiring is eliminated.

According to an aspect of the present disclosure, there is provided a display device comprising: a display unit defined by a display area and a non-display area located outside the display area, the display unit including pixels arranged in the display area, first sensing wirings electrically connected to the pixels, and auxiliary voltage wirings electrically separated from the pixels; and a sensing unit electrically connected to the first sensing wirings, wherein the first sensing wirings and the auxiliary voltage wirings extend in a first direction and are sequentially arranged along a second direction perpendicular to the first direction at first intervals, the first sensing wirings are spaced apart from each other along the second direction at second intervals greater than the first intervals and are electrically separated from each other, and the auxiliary voltage wirings are electrically connected to each other.

The auxiliary voltage wirings are electrically connected to each other in the non-display area.

A DC auxiliary is applied to the auxiliary voltage wirings.

The display device further comprising: second sensing wirings extending in the second direction and arranged to be spaced apart from each other along the second direction, wherein the second sensing wirings are respectively connected to the first sensing wirings, and the second sensing wirings are directly connected to the pixels.

The first sensing wirings respectively intersect the second sensing wirings, and the first sensing wirings are respectively connected to the second sensing wirings at intersection regions of the first sensing wirings and the second sensing wirings.

The auxiliary voltage wirings intersect the second sensing wirings, and are electrically separated from the second sensing wirings.

The second sensing wirings are spaced apart from each other with respect to some of the auxiliary voltage wirings.

The first sensing wirings are respectively connected to ends of the second sensing wirings.

The pixels include a first pixel configured to emit light of a first color and a second pixel configured to emit light of a second color, and the first sensing wirings are directly connected to the first pixel adjacent to the first sensing wirings and are indirectly connected to the second pixel adjacent thereto.

The pixels further include a third pixel configured to emit light of a third color, and the second pixel, the first pixel, the third pixel, and the first pixel are arranged sequentially and repeatedly along the second direction.

Each of the pixels includes a light emitting element, a driving transistor configured to supply a current to the light emitting element, and a sensing transistor including a first electrode electrically connected to the first electrode of the driving transistor and a second electrode electrically connected to one of the first sensing wirings.

The driving transistor includes a polycrystalline silicon semiconductor, and the sensing transistor includes an oxide semiconductor.

The first electrode and second electrode of the sensing transistor are disposed on the first conductive layer, the first sensing wirings and the auxiliary voltage wirings are disposed on a second conductive layer different from the first conductive layer, the first conductive layer and the second conductive layer are insulated from each other through a first insulating layer, each of the first sensing wirings includes a body extending in the first direction and a protrusion protruding from the body in the second direction to partially overlap the second electrode of the sensing transistor, and the protrusion is electrically connected to the second electrode of the sensing transistor through a contact hole.

The display device further comprising: a conductive pattern having the same shape as a protrusion of each of the first sensing wirings and disposed on a third conductive layer different from the first and second conductive layers, wherein the conductive pattern overlaps the second electrode of the sensing transistor and one of the auxiliary voltage wirings, and the conductive pattern is electrically connected to the second electrode of the sensing transistor and is electrically separated from the auxiliary voltage wirings.

The body connected to the protrusion of the sensing unit has a width greater than an average width of the first sensing wiring, and each of the auxiliary voltage wirings has a same shape as the body of each of the first sensing wirings.

The first electrode and second electrode of the sensing transistor is disposed on a first conductive layer, the first sensing wirings are disposed on a second conductive layer different from the first conductive layer, the auxiliary voltage wirings are disposed on a third conductive layer different from the first and second conductive layers, and the first to third conductive layers are connected to each other through insulating layers.

Each of the first sensing wirings includes a body extending in the first direction and a protrusion protruding from the body in the second direction to partially overlap the second electrode of the sensing transistor, and each of the auxiliary voltage wirings has a same shape as each of the auxiliary voltage wirings.

Each of the first sensing wirings includes a body extending in the first direction and a protrusion protruding from the body in the second direction to partially overlap the second electrode of the sensing transistor, each of the auxiliary voltage wirings has a same shape as the body, the second conductive layer is provided with a conductive pattern overlapping the second electrode of the sensing transistor and the auxiliary voltage wiring, and the conductive pattern is electrically connected to the second electrode of the sensing transistor and is electrically separated from the auxiliary voltage wirings.

The display device further comprising: second sensing wirings extending in the second direction and disposed to be spaced apart from each other in the second direction, wherein the second sensing wirings are electrically connected to the first sensing wirings, the second sensing wirings are disposed in different directions from each other with respect to the first auxiliary voltage wirings of the auxiliary voltage wirings, and the first auxiliary voltage wirings further include protrusions extending in the second direction and overlapping the second sensing wirings.

The first electrode and second electrode of the sensing transistor are disposed on a first conductive layer, the first auxiliary voltage wiring of the auxiliary voltage wirings and the first sensing wirings are disposed on a second conductive layer different from the first conductive layer, the second auxiliary voltage wiring of the auxiliary voltage wirings is disposed on a third conductive layer different from the first and second conductive layers, and the first to third conductive layers are insulated from each other through insulating layers.

According to another aspect of the present disclosure, there is provided a display device comprising: a substrate defined by a display area and a non-display area located outside the display area; a driving circuit layer including a transistor disposed on the display area of the substrate; a first insulating layer disposed on the driving circuit layer; and a first conductive layer including first sensing wirings and auxiliary voltage wirings disposed on the first insulating layer, wherein the first sensing wirings and the auxiliary voltage wirings extend in a first direction and are sequentially arranged along a second direction perpendicular to the first direction at first intervals, the first sensing wirings are spaced apart from each other in the second direction at second intervals greater than the first intervals, are electrically connected to the transistor through a contact hole, and are electrically separated from each other, and the auxiliary voltage wirings are electrically connected to each other in the non-display area.

The first sensing wirings are electrically connected to an external sensing circuit, and a DC auxiliary is applied to the auxiliary voltage wirings.

The display device further comprising: a light emitting element disposed on the first conductive layer, wherein the driving circuit layer includes a driving transistor configured to provide a driving current to the light emitting element, and a sensing transistor including a first electrode connected to the first electrode of the driving transistor and a second electrode connected to the first sensing wirings, and each of the first sensing wirings includes a body extending in the first direction and a protrusion protruding from the body in the second direction to partially overlap the second electrode of the sensing transistor, and the protrusion is electrically connected to the second electrode of the sensing transistor through a contact hole.

The display device further comprising: a conductive pattern having the same shape as the protrusion of each of the first sensing wirings and disposed on the driving circuit layer and a second conductive layer between the first conductive layer and the light emitting element, wherein the conductive pattern overlaps the second electrode of the sensing transistor and one of the auxiliary voltage wirings, is electrically connected to the second electrode of the sensing transistor, and is electrically separated from the auxiliary voltage wiring.

The body connected to the protrusion of the sensing unit has a width greater than an average width of the first sensing wiring, and each of the auxiliary voltage wirings has the same shape as the body.

According to another aspect of the present disclosure, there is provided a display device comprising: a substrate defined by a display area and a non-display area located outside the display area; a driving circuit layer including a transistor disposed on the display area of the substrate; a first insulating layer disposed on the driving circuit layer; a first conductive layer including first sensing wirings disposed on the first insulating layer, extending in the first direction, and spaced apart from each other along a second direction perpendicular to the first direction at first intervals; and a second conductive layer including auxiliary voltage wirings disposed on the first conductive layer, extending in the first direction, spaced apart from the first sensing wirings along the second direction at second intervals smaller than the first intervals, and spaced from each other at the second intervals, wherein the first sensing wirings are electrically connected to the transistor through a contact hole and are electrically separated from each other, and the auxiliary voltage wirings are electrically connected to each other in the non-display area.

The display device further comprising: a light emitting element disposed on the second conductive layer, wherein the driving circuit layer includes a driving transistor configured to provide a driving current to the light emitting element, and a sensing transistor including a first electrode connected to the first electrode of the driving transistor and a second electrode connected to the first sensing wirings, and each of the first sensing wirings includes a body extending in the first direction and a protrusion protruding from the body in the second direction to partially overlap the second electrode of the sensing transistor, and the protrusion is electrically connected to the second electrode of the sensing transistor through a contact hole.

Each of the first sensing wirings includes a body extending in the first direction and a protrusion protruding from the body in the second direction to partially overlap the second electrode of the sensing transistor, and each of the auxiliary voltage wirings have a same shape as the body.

Each of the first sensing wirings includes a body extending in the first direction and a protrusion protruding from the body in the second direction to partially overlap the second electrode of the sensing transistor, and each of the auxiliary voltage wirings have a same shape as the body, the first conductive layer is provided with a conductive pattern overlapping the second electrode of the sensing transistor and the auxiliary voltage wiring, and the conductive pattern is electrically connected to the second electrode of the sensing transistor and is electrically separated from the auxiliary voltage wirings.

The display device further comprising: a fourth conductive layer disposed between the driving circuit layer and the first conductive layer, wherein the fourth conductive layer includes second sensing wirings extending in the second direction and disposed to be spaced apart from each other in the second direction, the second sensing wirings are electrically connected to first sensing wirings, and the second sensing wirings are disposed in different directions from each other with respect to first auxiliary voltage wirings of the auxiliary voltage wirings, and each of the first auxiliary voltage wirings further include a protrusion extending in the second direction to overlap one of the second sensing wirings.

The display device further comprising: second auxiliary voltage wirings disposed on the first conductive layer, extending in the first direction, and spaced apart from the first sensing wirings and the auxiliary voltage wirings at third intervals smaller than the first and second intervals, wherein the second auxiliary voltage wirings are electrically connected to the first auxiliary voltage wirings on the non-display area.

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

The present inventive concept will now be described more fully hereinafter with reference to the accompanying drawings, in which preferred embodiments of the inventive concept are shown. This inventive concept may, however, be embodied in different forms and should not be construed as limited to the embodiments set forth herein. Rather, these embodiments are provided so that this disclosure will be thorough and complete, and will filly convey the scope of the inventive concept to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Hereinafter, embodiments of the present inventive concept will be described with reference to the attached drawings.

Hereinafter, embodiments of the present inventive concept will be described with reference to the attached drawings.

Figure 1:
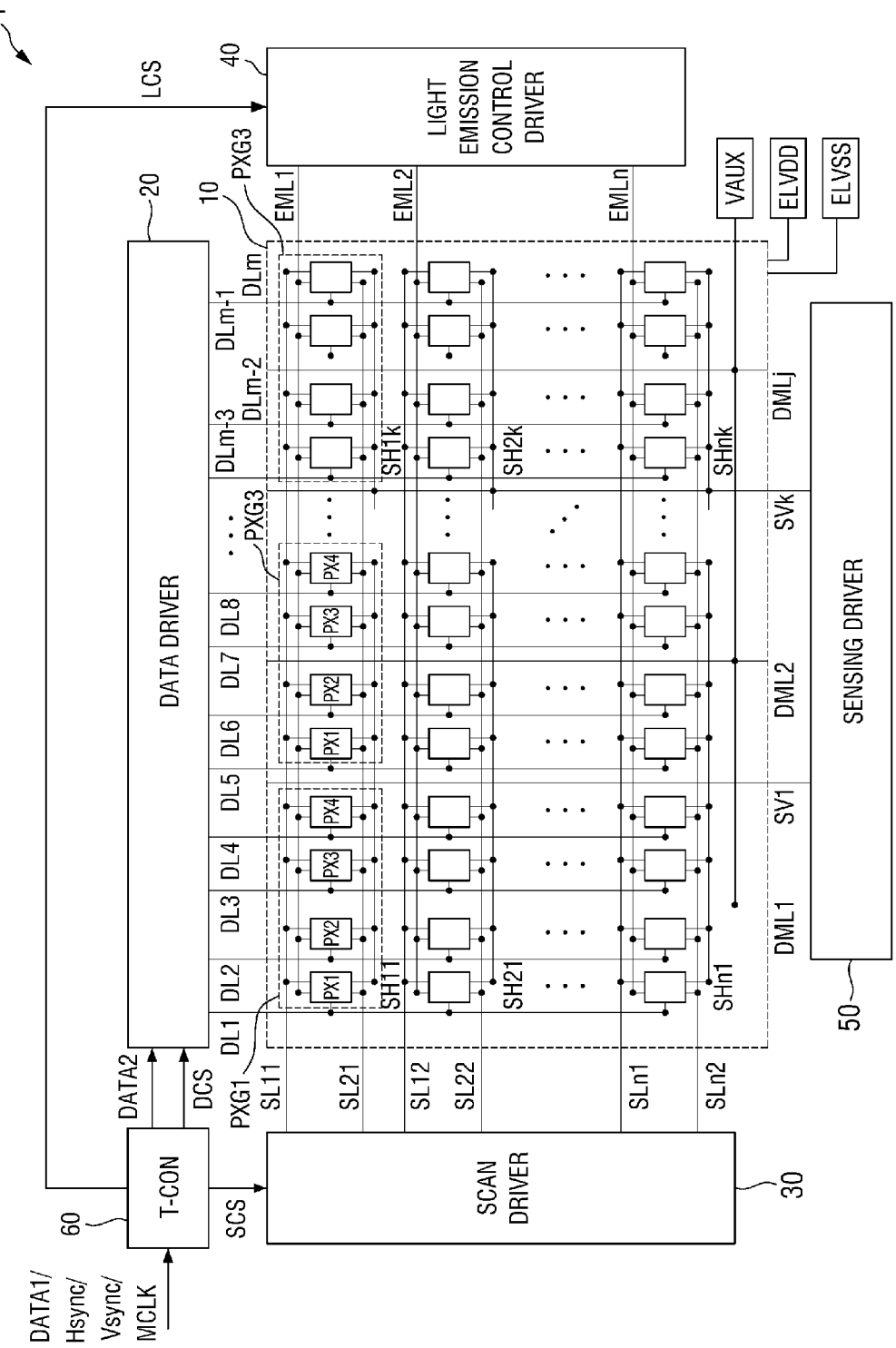
FIG. 1 is a block diagram of a display device according to an embodiment.

FIG. 1 is a block diagram of a display device according to an embodiment.

Referring to FIG. 1, a display device 1 may include a display unit 10 (or a display panel), a data driver 20, a scan driver 30, a light emission control driver 40, a sensing unit 50 (or sensing driver), and a controller 60 (or T-con).

The display device 1 (and the display unit 10) may include scan lines SL11 to SL1n and SL21 to SL2n (n is an integer of 2 or more), data lines DL1 to DLm (m is an integer of 2 or more), light emission control lines EML1 to EMLn, and pixels PX1, PX2, PX3, and PX4.

Each of the scanning lines SL11 to SL1n and SL21 to SL2n may extend in the row direction. Each of the light emission control lines EML1 to EMLn may extend in the row direction (first direction or horizontal direction). Each of the data lines DL1 to DLm may extend in the column direction (second direction or vertical direction). Here, the column direction is perpendicular to the row direction, and the row direction and the column direction may be mutually reversed.

The pixels PX1, PX2, PX3, and PX4 may be arranged in the intersection area of the scan lines SL11 to SL1n and SL21 to SL2n (n is an integer of 2 or more), the data lines DL1 to DLm (m is an integer of 2 or more), and the light emission control lines EML1 to EMLn. The pixels PX1, PX2, PX3, and PX4 may be arranged in a matrix form. Hereinafter, in a description of common characteristics of the pixels PX1, PX2, PX3, and PX4, the pixels PX1, PX2, PX3, and PX4 will be referred to as a pixel PX and/or pixels PX.

The pixel PX may be connected to two scan lines, one data line, and one light emission control line. Further, the pixel PX may be connected to horizontal sensing wirings SH11 to SH1k, SH21 to SH2k, to SHn1 to SHnk, which will be described later. For example, the pixel PX located in the first row (or first pixel row) and the first column (or first pixel column) may be connected to the eleventh and twenty first scan lines SL11 and SL21, the first data line DL1, the first light emission control line EML1, and the eleventh horizontal sensing wiring SH11.

The pixels PX1, PX2, PX3, and PX4 may emit light in mutually different monochromatic colors and/or mutually the same color. The first to fourth pixels PX1, PX2, PX3, and PX4 may be included in one unit pixel group (for example, first to third pixel groups PXG1 to PXG3). That is, all the pixels PX in the display unit 10 may be grouped into the pixel groups PXG1, PXG2, and PXG3 according to the arrangement pattern of the pixels PX1, PX2, PX3, and PX4. The arrangement of the pixels PX1, PX2, PX3, and PX4 will be described later with reference to FIGS. 2A to 2C.

The display device 1 (and the display unit 10) may further include horizontal sensing wirings (or second sensing wirings) SH11 to SH1k, SH21 to SH2k, to SHn1 to SHnk (k is an integer of 2 or more), vertical sensing wirings SV1 to SVk (or first sensing wirings), and auxiliary voltage wirings DML1 to DMLj (j is an integer of 2 or more). Here, the vertical sensing wirings SV1 to SVk (or the first sensing wirings) and the auxiliary voltage wirings DML1 to DMLj may be collectively referred to as vertical wirings, and the vertical wirings may be spaced apart from each other at regular intervals.

The horizontal sensing wirings SH11 to SH1k, SH21 to SH2k, to SHn1 to SHnk may extend in the row direction, and may be arranged along the column direction. For example, the 11th to 1kth horizontal sensing wirings may be sequentially arranged along the first row, and may be separated or spaced apart from each other. Similarly, the 21th to 2kth horizontal sensing wirings are sequentially arranged along the second row, and the n1th to n2kth horizontal sensing wirings are sequentially arranged along the nth row.

The horizontal sensing wirings SH11 to SH1k, SH21 to SH2k, to SHn1 to SHnk may be connected to the pixels PX. For example, the 11th horizontal sensing wiring SH11 may be connected to the pixels PX included in (or located in) the first to eighth columns in the first row, and the 1kth horizontal sensing line SH1k may be connected to the pixels PX included in the m-7th to mth columns. That is, each of the horizontal sensing wirings SH11 to SH1k, SH21 to SH2k, to SHn1 to SHnk may be connected to eight pixels PX or two pixel groups, and two pixel groups may share one horizontal sensing wiring (that is, one of the horizontal sensing wirings SH11 to SH1k, SH21 to SH2k, to SHn1 to SHnk). However, this is illustrative, and the present inventive concept is not limited thereto. For example, each of the horizontal sensing wirings SH11 to SH1k, SH21 to SH2k, to SHn1 to SHnk may be connected to two, four, six, eight or more pixels PX, or may be connected to three or more pixel groups.

The vertical sensing wirings SV1 to SVk may each extend in the column direction, and may be arranged to be spaced apart from each other at first intervals along the row direction. The vertical sensing wirings SV1 to SVk correspond one-to-one to the horizontal sensing wirings included in one row (for example, the 11th to 1kth horizontal sensing wirings SH11 to SH1k and SH21 to SH2k), and thus the vertical sensing wirings SV1 to SVk, similarly to the 11th to 1kth horizontal sensing wirings SH11 to SH1k, may be arranged to be spaced apart from each other at intervals corresponding to eight pixels PX.

The vertical sensing wirings SV1 to SVk may be connected to the horizontal sensing wirings SH11 to SH1k, SH21 to SH2k, to SHn1 to SHnk. For example, the first vertical sensing wiring SV1 may be connected to the 11th horizontal sensing wiring SH11, the 21-st horizontal sensing wiring SH21, and the n1-st horizontal sensing wiring SHn1.

The arrangements of the vertical sensing wirings SV1 to SVk and the horizontal sensing wirings SH11 to SH1k, SH21 to SH2k, to SHn1 to SHnk in the display unit 10 and the connection relationship therebetween will be described later with reference to FIGS. 2A to 2C.

The auxiliary voltage wirings DML1, DML2 to DMLj may extend in the column direction, and may be arranged to be spaced apart from each other at second intervals along the row direction between the vertical sensing lines SV1 to SVk. The arrangement intervals of the auxiliary voltage wirings DML1, DML2 to DMLj may be equal to or smaller than the arrangement intervals of the vertical sensing wirings SV1 to SVk. For example, the auxiliary voltage wirings DML1, DML2 to DMLj may be arranged to be spaced apart from each other between the vertical sensing lines SV1 to SVk (that is, adjacent to and not overlapping the vertical sensing wirings SV1 to SVk) at intervals corresponding to two pixels.

An auxiliary voltage VAUX may be applied to the auxiliary voltage DML1, DML2 to DMLj. Here, the auxiliary voltage VAUX may be a DC voltage. For example, the auxiliary voltage wirings DML1, DML2 to DMLj may be connected to an external power supply unit (or a power supply unit) to receive the auxiliary voltage VAUX. As another example, the auxiliary voltage wirings DML1, DML2 to DMLj may be connected to a first power supply voltage wiring, which will be described later, at an outer periphery of the display unit 10 (or a non-display area of the display unit 10 where pixels PX are not arranged) to receive a first power supply voltage ELVDD.

As the vertical sensing wirings SV1 to SVk are arranged to be spaced apart at specific intervals (for example, intervals corresponding to eight pixels PX), Some pixels PX (for example, pixels PX included in the fourth pixel column) arranged adjacent to the vertical sensing wirings SV1 to SVk may have characteristics different from characteristics (for example, the light emission characteristics) of other pixels PX (for example, pixels PX included in the second pixel column and pixels included in the sixth pixel column) spaced apart from the vertical sensing wirings SV1 to SVk, and vertical lines of a specific color may appear on the image displayed through the display unit 10 due to such a characteristic difference. Therefore, as the auxiliary voltage wirings DML1, DML2 to DMLj are arranged between the vertical sensing wirings SV1 to SVk in a manner similar to the arrangement of the vertical sensing wirings SV1 to SVk, the corresponding pixels PX (for example, the pixels PX included in the second pixel column, the fourth pixel column, and the sixth pixel column) may have the same characteristics, and thus deterioration of image quality (for example, occurrence of vertical lines of a specific color) may be prevented.

Although not shown in FIG. 1, the display unit 10 may include a first power voltage wiring (or a first power voltage supply line) and a second power voltage wiring (or a second power voltage supply line). As will be described later with reference to FIG. 4, the first power supply voltage wiring may supply a first power supply voltage ELVDD to the pixels PX, and the first power supply voltage wirings may be arranged in a mesh form. The second power supply voltage wiring may supply a second power supply voltage ELVSS to the pixels PX, and the second power supply voltage wirings may also be arranged in a mesh form. However, the present inventive concept is not limited thereto, and the extending direction of the first power supply voltage wiring and the extending direction of the second power supply voltage wiring may be variously changed.

The data driver 20 may provide a data signal to the pixels PX through the data lines DL1 to DLm.

The scan driver 30 may generate first and second scan signals, and may provide the first and second scan signals to the pixel PX through the scan lines SL11 to SL1$n$ and SL21 to SL2$n$. For example, when the first scan signal is supplied to the first pixel PX1 through the first scan line SL11, the data signal may be provided to the first pixel PX1 through the first data line DL1. The first and second scan signals will be described later with reference to FIG. 3.

The light emission control driver 40 may generate a light emission control signal, and may provide the light emission control signal to the pixels PX through the light emission control lines EML1 to EMLn. The light emission control driver 40 (or the display device 1) may adjust the light emission time of the pixels PX based on the light emission control signal. Meanwhile, although it is shown in the drawing that the light emission control driver 40 is separately implemented independent of the scan driver 30, the present inventive concept is not limited thereto. For example, the light emission control driver 40 may be included in the scan driver 30 and integrated with the scan driver 30. As another example, the light emission control driver 40 may be omitted depending on the circuit configuration of the pixel PX.

The sensing unit 50 may apply a sensing voltage to the pixel PX through the vertical sensing wirings SV1 to SVk (and the horizontal sensing wirings SH11 to SH1$k$, SH21 to SH2$k$, to SHn1 to SHnk), and may measure a sensing current. The characteristics (For example, threshold voltage and mobility) of a transistor in the pixel PX may be measured based on the sensing current. Meanwhile, although it is shown in the drawing that the sensing unit 50 is separately implemented independent of the data driver 20, the present inventive concept is not limited thereto. For example, the sensing unit 50 may be included in the data driver 20 and integrated with the data driver 20, or may be disposed adjacent the data driver 20 such that it is on the same side of display unit 10 as the data driver 20.

The sensing unit 50 may measure the characteristics (or average characteristics) of the pixels PX included in the specific area (for example, eight pixels PX included in the two pixel groups) depending on the connection configuration of the vertical sensing wirings SV1 to SVk and the horizontal sensing wirings SH11 to SH1$k$, SH21 to SH2$k$, to SHn1 to SHnk. Since pixels PX located adjacent to each other display a similar image or receive a similar voltage (for example, a similar voltage-dropped power supply voltage or signal), pixels PX adjacent to each other may have similar characteristics. Accordingly, sensing efficiency (that is, capacitance of the sensing unit 50) may be greatly reduced, while compensation efficiency does not decrease much as compared with technologies of sensing each of the pixels and compensating for a change in characteristics of each of the pixels.

The controller 60 may convert video signals DATA1 transferred from an external device (for example, an application processor) into video data signals DATA2 and transmit the video data signals DATA2 to the data driver 20. The controller 60 may receive a vertical synchronization signal Vsync, a horizontal synchronization signal Hsync, and a clock signal MCLK, generate control signals for controlling the operation (or driving) of the scan driver 30, the data driver 20, and the light emission control driver 40, and provide the control signals to the scan driver 30, the data driver 20, and the light emission control driver 40, respectively. Here, the control signals may include a scan driving control signal SCS for controlling the scan driver 30, a data driving control signal DCS for controlling the data driver 20, and a light emission driving control signal LCS for controlling the light emission control driver 40.

Meanwhile, the display device 1 may further include a power supply unit (not shown). The power supply unit may generate a first power supply voltage ELVDD and a second power supply voltage ELVSS, and provide the first power supply voltage ELVDD and the second power supply voltage ELVSS to the pixels PX through the first power supply voltage wiring and the second power supply voltage wiring, respectively. Here, the first power supply voltage ELVDD may be a predetermined high level voltage, the second power supply voltage ELVSS may be a predetermined low level voltage, and the voltage level of the second power supply voltage ELVSS may be lower than the voltage level of the first power supply voltage ELVDD. Meanwhile, the power supply unit may be implemented as an external voltage source.

Further, the power supply unit may generate an auxiliary voltage VAUX, and apply the auxiliary voltage VAUX to the auxiliary voltage lines DML1 to DMLj.

As described above with reference to FIG. 1, the display device 1 may sense the characteristics of the pixels PX through the sensing unit 50 located outside the display unit 10, and may group a plurality of pixels PX (for example, eight pixels PX included in two pixel groups) and sense the characteristics (or average characteristics) of these pixels PX. Thus, the vertical sensing wirings SV1 to SVk may be arranged to be spaced apart from each other at specific intervals (for example, intervals corresponding to eight pixels PX). Since the auxiliary voltage wirings DML1 to DMLj are arranged between the vertical sensing wirings SV1 to SVk in a manner similar to the arrangement of the vertical sensing wirings SV1 to SVk, the spatial frequency of the display unit 10 may be improve, and the pixels PX have the same or similar characteristics regardless of whether or not they are adjacent to the vertical sensing wirings SV1 to SVk, so that deterioration of display quality (for example, occurrence of vertical lines of a specific color) may be prevented.

Figure 2A:
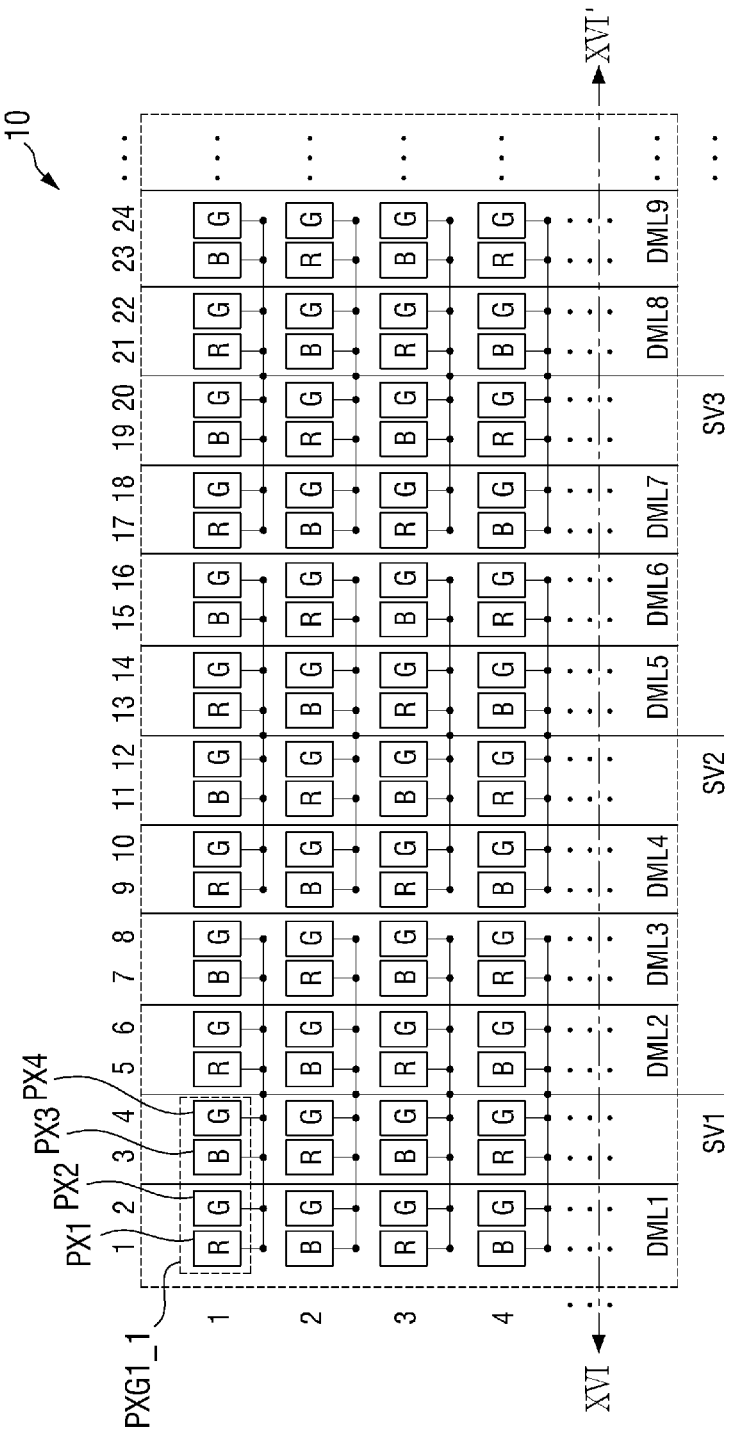
FIGS. 2A, 2B, and 2C are circuit diagrams showing examples of display units included in the display device of FIG. 1.
Figure 2B:
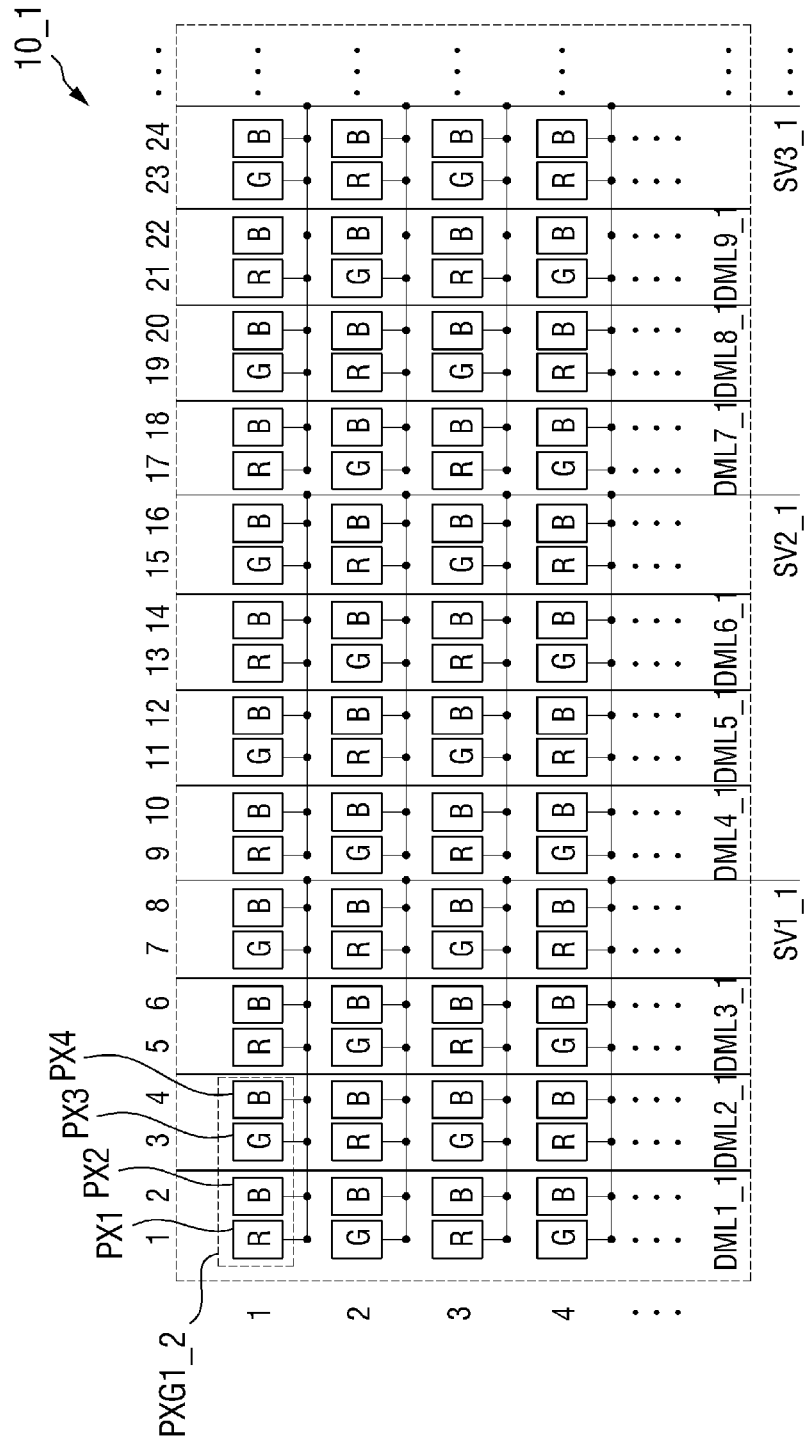
Figure 2C:
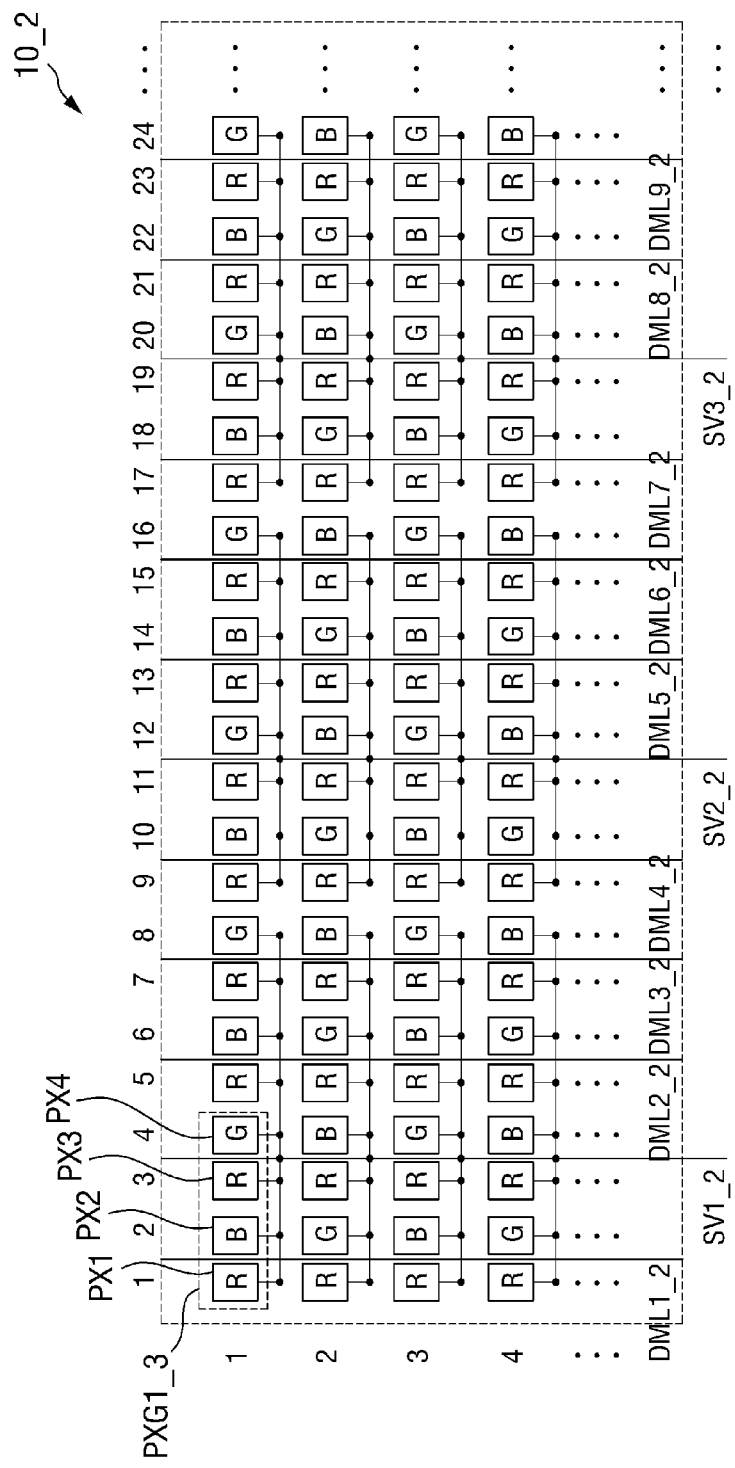

FIGS. 2A to 2C are circuit diagrams showing examples of display units included in the display device of FIG. 1.

Referring to FIGS. 2A to 2C, the first pixel PX1 (or first sub-pixel, first type pixel, or first color pixel) may be a red pixel emitting light of a first color R (for example, red), the second pixel PX2 (or second sub-pixel, second type pixel, or second color pixel) may be a green pixel emitting light of a second color G (for example, green), the third pixel PX3 (or third sub-pixel, third type pixel, or third color pixel) may be a blue pixel emitting light of a third color B (for example, blue), and the fourth pixel PX4 (or fourth sub-pixel, fourth type pixel, or fourth color pixel) may be a green pixel emitting light of a second color G (for example, green). The fourth pixel PX4 may be substantially the same as the second pixel PX2. The first pixel groups PXG1_1 each including the first to fourth pixels PX1 to PX4 may be repeatedly arranged along the row direction. That is, the display unit 10 may have an RGBG pentile pixel arrangement.

The vertical sensing wirings SV1 to SVk and the auxiliary voltage wirings DML1 to DMLj may be arranged adjacent to green pixels or a pixel column including only the green pixels.

As shown in FIG. 2A, the first vertical sensing wiring SV1 may be disposed between the fourth pixel column and the fifth pixel column, the second vertical sensing wiring SV2 may be disposed between the twelfth pixel column and the thirteenth pixel column, and the third vertical sensing wiring SV3 may be disposed between the twentieth pixel column and the twentyfirst pixel column. That is, the kth vertical sensing wiring SVk may be disposed between the (8*k-4)th pixel column and the (8*k-3)th pixel column.

Similarly, the first auxiliary voltage wiring DML1 may be disposed between the second pixel column and the third pixel column, the second auxiliary voltage wiring DML2 may be disposed between the sixth pixel column and the seventh pixel column, and the third auxiliary voltage wiring DML3 may be disposed between the eighth pixel column and the ninth pixel column. That is, the auxiliary voltage wirings DML1 to DML9 may be disposed adjacent to the remaining green pixels (or the pixel column including only the remaining green pixels) not directly adjacent, i.e., neighborly, to the first vertical sensing wiring SV1, respectively.

The vertical sensing wirings SV1 to SVk may be connected to the center of each of the horizontal sensing wirings SH11 to SH1$k$, SH21 to SH2$k$, to SHn1 to SHnk. That is, the respective horizontal sensing wirings SH11 to SH1$k$, SH21 to SH2$k$, to SHn1 to SHnk may be symmetrical with respect to the corresponding (that is, connected and/or intersecting) vertical sensing wiring. However, the present inventive concept is not limited thereto. For example, the vertical sensing wirings SV1 to SVk may be connected to one end of each of the horizontal sensing wirings SH11 to SH1$k$, SH21 to SH2$k$, to SHn1 to SHnk.

Referring to FIGS. 1, 2A, and 2B, a display unit 10_1 of FIG. 2B may be substantially the same as the display unit 10 having been described with reference to FIG. 2A, except for the arrangement of pixels PX1 to PX4 and the arrangement of vertical sensing wirings SV1_1 to SV3_1. Therefore, a redundant description will not be repeated.

The first pixel PX1 may be a red pixel, the second pixel PX2 may be a blue pixel, the third pixel PX3 may be a green pixel, and the fourth pixel PX4 may be a blue pixel. The second pixel PX2 and the fourth pixel PX4 may be substantially the same as each other. The first pixel group PXG1_2 includes RBGB pixels, and the first pixel groups PXG1_2 may be repeatedly arranged along the row direction. That is, the display unit 10_1 may have an RBGB pentile pixel arrangement.

The vertical sensing wirings SV1_1 to SV3_1 and the auxiliary voltage wirings DML1 to DM9_1 may be arranged adjacent to blue pixels or a pixel column including only the blue pixels.

As shown in FIG. 2B, the first vertical sensing wiring SV1_1 may be disposed between the eighth pixel column and the ninth pixel column, the second vertical sensing wiring SV2_1 may be disposed between the sixteenth pixel column and the seventeenth pixel column, and the third vertical sensing wiring SV3_1 may be disposed between the twenty fourth pixel column and the twenty fifth pixel column. That is, the kth vertical sensing wiring SVk may be disposed between the (8*k)th pixel column and the (8*k+1)th pixel column.

Similarly, the first auxiliary voltage wiring DML1_1 may be disposed between the second pixel column and the third pixel column, the second auxiliary voltage wiring DML2_1 may be disposed between the fourth pixel column and the fifth pixel column, and the third auxiliary voltage wiring DML3_1 may be disposed between the sixth pixel column and the seventh pixel column. That is, the auxiliary voltage wirings DML1_1 to DML9_1 may be disposed adjacent to the remaining blue pixels (or the pixel column including only the remaining blue pixels) not directly adjacent, i.e. neighborly, to the first vertical sensing wiring SV1, respectively.

The vertical sensing wirings SV1_1 to SV3_1 may be connected to one end of each of the horizontal sensing wirings SH11 to SH1$k$, SH21 to SH2$k$, to SHn1 to SHnk. However, the present inventive concept is not limited thereto.

Referring to FIGS. 1, 2A, and 2C, a display unit 10_2 of FIG. 2C may be substantially the same as the display unit 10 having been described with reference to FIG. 2A, except for the arrangement of pixels PX1 to PX4 and the arrangement of vertical sensing wirings SV1_1 to SV3_1. Therefore, a redundant description will not be repeated.

The first pixel PX1 may be a red pixel, the second pixel PX2 may be a blue pixel, the third pixel PX3 may be a red pixel, and the fourth pixel PX4 may be a green pixel. The first pixel PX1 and the third pixel PX3 may be substantially the same as each other. The first pixel group PXG1_3 includes RBRG pixels, and the first pixel groups PXG1_3 may be repeatedly arranged along the row direction. That is, the display unit 10_2 may have an RBRG pentile pixel arrangement.

The vertical sensing wirings SV1_2 to SV3_2 and the auxiliary voltage wirings DML1 to DM9_2 may be arranged adjacent to blue pixels or a pixel column including only the blue pixels.

As shown in FIG. 2C, the first vertical sensing wiring SV1_2 may be disposed between the third pixel column and the fourth pixel column, the second vertical sensing wiring SV2_2 may be disposed between the eleventh pixel column and the twelfth pixel column, and the third vertical sensing wiring SV3_2 may be disposed between the nineteenth pixel column and the twentieth pixel column. That is, the kth vertical sensing wiring SVk may be disposed between the (8*k-5)th pixel column and the (8*k-4)th pixel column.

Similarly, the first auxiliary voltage wiring DML1_2 may be disposed between the first pixel column and the second pixel column, the second auxiliary voltage wiring DML2_2 may be disposed between the fifth pixel column and the sixth pixel column, and the third auxiliary voltage wiring DML3_2 may be disposed between the seventh pixel column and the eighth pixel column. That is, the auxiliary voltage wirings DML1_2 to DML9_2 may be disposed adjacent to the remaining blue pixels (or the pixel column including only the remaining blue pixels) not adjacent to the first vertical sensing wiring SV1, respectively.

The vertical sensing wirings SV1_2 to SV3_2 may be connected to the center of each of the horizontal sensing wirings SH11 to SH1$k$, SH21 to SH2$k$, to SHn1 to SHnk.

The horizontal sensing wirings SH11 to SH1k, SH21 to SH2k, to SHn1 to SHnk may be symmetrical with respect to the corresponding vertical sensing wiring. However, the present inventive concept is not limited thereto.

As described above with reference to FIGS. 2A to 2C, the display units 10, 10_1, and 10_2 may have RGBG, RBGB, and RBRG pentile pixel arrangements, respectively. The vertical sensing wirings and the auxiliary voltage wirings may be disposed adjacent to any pixel (for example, a green, blue, or red pixel), and may also be connected to any portion (for example, center or end) of each of the horizontal sensing wirings.

Figure 3:
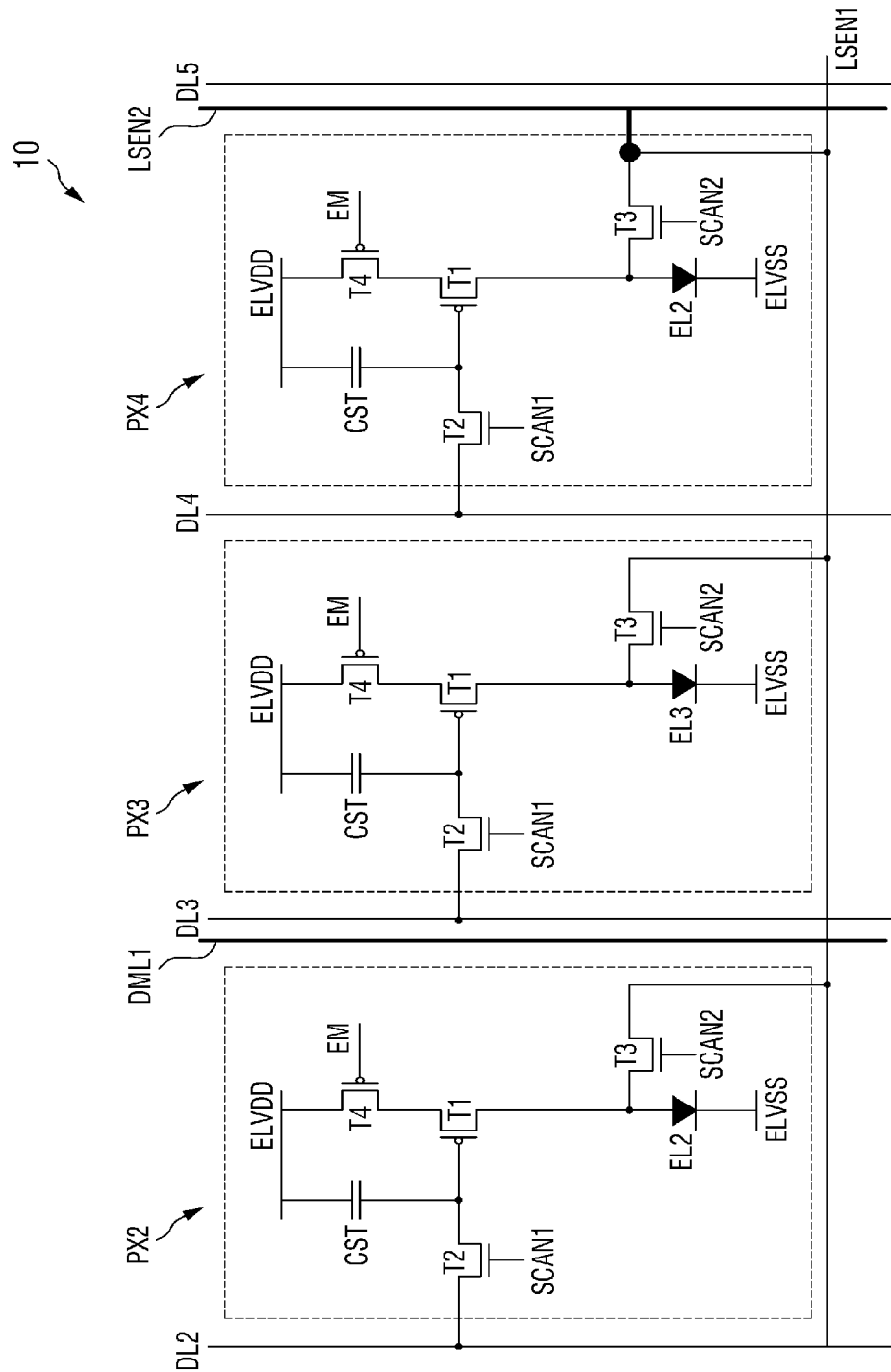
FIG. 3 is a circuit diagram showing an example of pixels included in the display unit of FIG. 2A.

FIG. 3 is a circuit diagram showing an example of pixels included in the display unit of FIG. 2A.

Referring to FIG. 3, the pixels PX (or each of the second pixel PX2, the third pixel PX3, and the fourth pixel PX4) may include a light emitting element EL (or organic light emitting diode), first to fourth transistors T1 to T4, and a storage capacitor CST. A data signal DATA, a first scan signal SCAN1, a second scan signal SCAN2, and a light emission control signal EM may be provided to the pixels PX. Here, each of the first scan signal SCAN1 and the second scan signal SCAN2 may have an impulse waveform. For example, each of the first scan signal SCAN1 and the second scan signal SCAN2 may have a logic high level (a potential of a high voltage level or a turn-on voltage) in an impulse section, and may have a logic low level (that is, a voltage level lower than a logic high level, or a potential of a low voltage level or a turn-off voltage) in the remaining section. The second scan signal SCAN2 may be substantially the same as the first scan signal SCAN1. The light emission control signal EM may have an impulse waveform, and may have a logic low level in the impulse section and have a logic high level in the remaining section. That is, the waveform of the light emission control signal EM may be similar to the signal in which the first and second scan signals SCAN1 and SCAN2 are inverted.

Each of the first to fourth transistors T1 to T4 may include a first electrode, a second electrode, and a gate electrode. One of the first electrode and the second electrode may be a source electrode, and the other of the first electrode and the second electrode may be a drain electrode.

Each of the first to fifth transistors T1 to T4 may be a thin film transistor. Each of the first to fourth transistors T1 to T4 may include an oxide semiconductor or a polycrystalline silicon semiconductor.

In an embodiment, each of the first transistor T1 and the fourth transistor T4 may include a polycrystalline silicon semiconductor, and each of the second transistor T2 and third transistor T3 may include an oxide semiconductor. The transistor including an oxide semiconductor has relatively excellent turn-off characteristics as compared with the transistor including a polycrystalline silicon semiconductor. When each of the third transistor T3 and the fourth transistor T4 includes an oxide semiconductor, the leakage of a driving current Id in the light emission period of the light emitting element EL may be reduced.

Hereinafter, each of the configurations of the pixel PX will be described in detail.

First, the light emitting element EL may include an anode electrode and a cathode electrode. The cathode electrode of the light emitting element EL may be connected to the second power supply voltage wiring (that is, the power supply voltage wiring supplying the second power supply voltage ELVSS). Here, the light emitting element EL collectively refers to a first light emitting element (not shown), a second light emitting element EL2, and a third light emitting element EL3, and the first to third light emitting elements EL2 to EL3 may emit light of different colors.

The first transistor T1 (or driving transistor) may include a first electrode indirectly connected to the first power supply voltage wiring (that is, power supply voltage wiring supplying the first power supply voltage ELVDD), a second electrode connected to a second node N2, and a gate electrode connected to a fourth node N4. The first transistor T1 may provide a driving current Id to the light emitting element EL based on a gate voltage (or a data voltage stored in the storage capacitor CST to be described later).

The second transistor T2 (or switching transistor) may include a first electrode connected to a data line (or receiving data DATA), a second electrode connected to the gate electrode of the first transistor T1, and a gate electrode connected to the first scan line (for example, the eleventh scan line SL11 shown in FIG. 1) or receiving the first scan signal SCAN1. The second transistor T2 may be turned on in response to the first scan signal SCAN1 and may transmit the data signal DATA to the first node N1.

The fourth transistor T4 (or light emission control transistor) may include a first electrode connected to the first power supply voltage wiring to receive the first power supply voltage ELVDD, a second electrode connected to the first electrode of the first transistor T1, and a gate electrode connected to the light emission control line (for example, the first light emission control line EML1 shown in FIG. 1) or receiving the light emission control signal EM.

The fourth transistor T4 is turned on in response to the light emission control signal EM. In this case, a driving current Id is provided to the light emitting element EL, and the light emitting element EL may emit light with the luminance corresponding to the driving current Id.

The third transistor T3 may include a first electrode connected to the second electrode of the first transistor T1, a second electrode connected to the horizontal sensing wiring LSEN1 (for example, the eleventh horizontal sensing wiring SH11 shown in FIG. 1), and a gate electrode connected to the second scan signal line (for example, the twenty first scan line S21 shown in FIG. 1) to receive the second scan signal SCAN2.

The third transistor T3 is turned on in response to the second scan signal SCAN2. In this case, a sensing voltage is applied from the sensing unit 50 to the first transistor T1, a sensing current flows from the sensing unit 50 to the first transistor T1, and the sensing unit 50 may measure the sensing current.

Meanwhile, the vertical sensing wiring LSEN2 may be substantially the same as the first vertical sensing wiring SV1 shown in FIG. 1. The vertical sensing wiring LSEN2 may be disposed adjacent to one side of the fourth pixel PX4 (for example, the right side spaced apart from the third pixel PX3), and may be connected to the second electrode of the third transistor T3 of the fourth pixel PX4. That is, the vertical sensing wiring LSEN2 is not directly connected to the horizontal sensing wiring LSEN1, and may be connected to the horizontal sensing wiring LSEN1 through the second electrode of the third transistor T3 (or a pattern or line connected between the third transistor T3 and the horizontal sensing line LSEN1). However, the present inventive concept is not limited thereto, and the vertical sensing wiring LSEN2 may be directly connected to the horizontal sensing wiring LSEN1 at an intersection with the horizontal sensing wiring LSEN1.

Similarly to the vertical sensing wiring LSEN2, the auxiliary voltage wiring DML1 may be disposed adjacent to one side of the second pixel PX2 substantially the same as the fourth pixel PX4.

Meanwhile, although it is shown in FIG. 3 that the pixel PX includes 4T1C (that is, four transistors T1 to T4 and one capacitor CST), this is illustrative, and the pixel PX is not limited thereto. For example, the pixel PX may have a structure of 5T1C, 6T1C, or the like, and details thereof will be described later with reference to FIG. 17.

As described above with reference to FIG. 3, the pixel PX includes the second and third transistors T2 and T3 including an oxide semiconductor, thereby reducing the leakage of a driving current.

Figure 4:
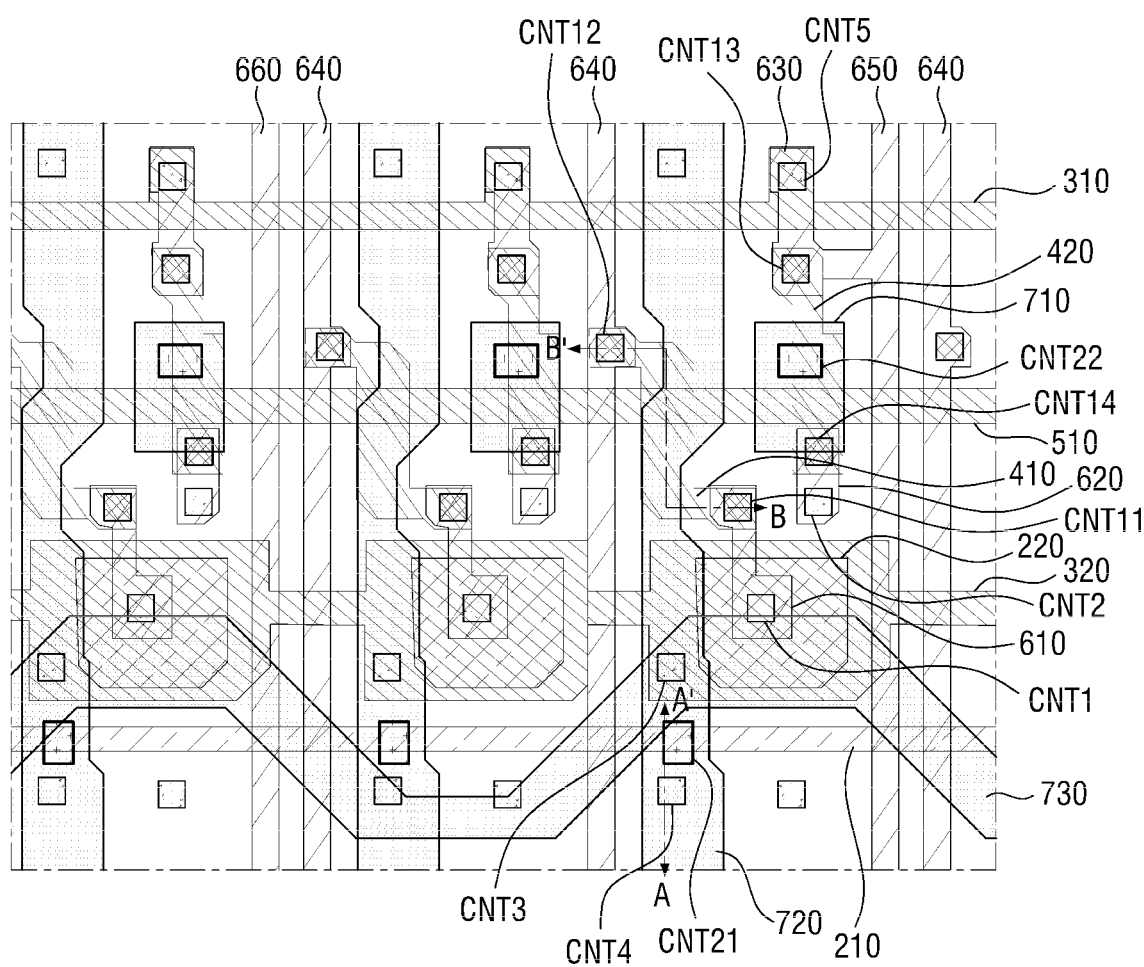
FIG. 4 is a layout diagram of the pixels of FIG. 3.
Figure 5:
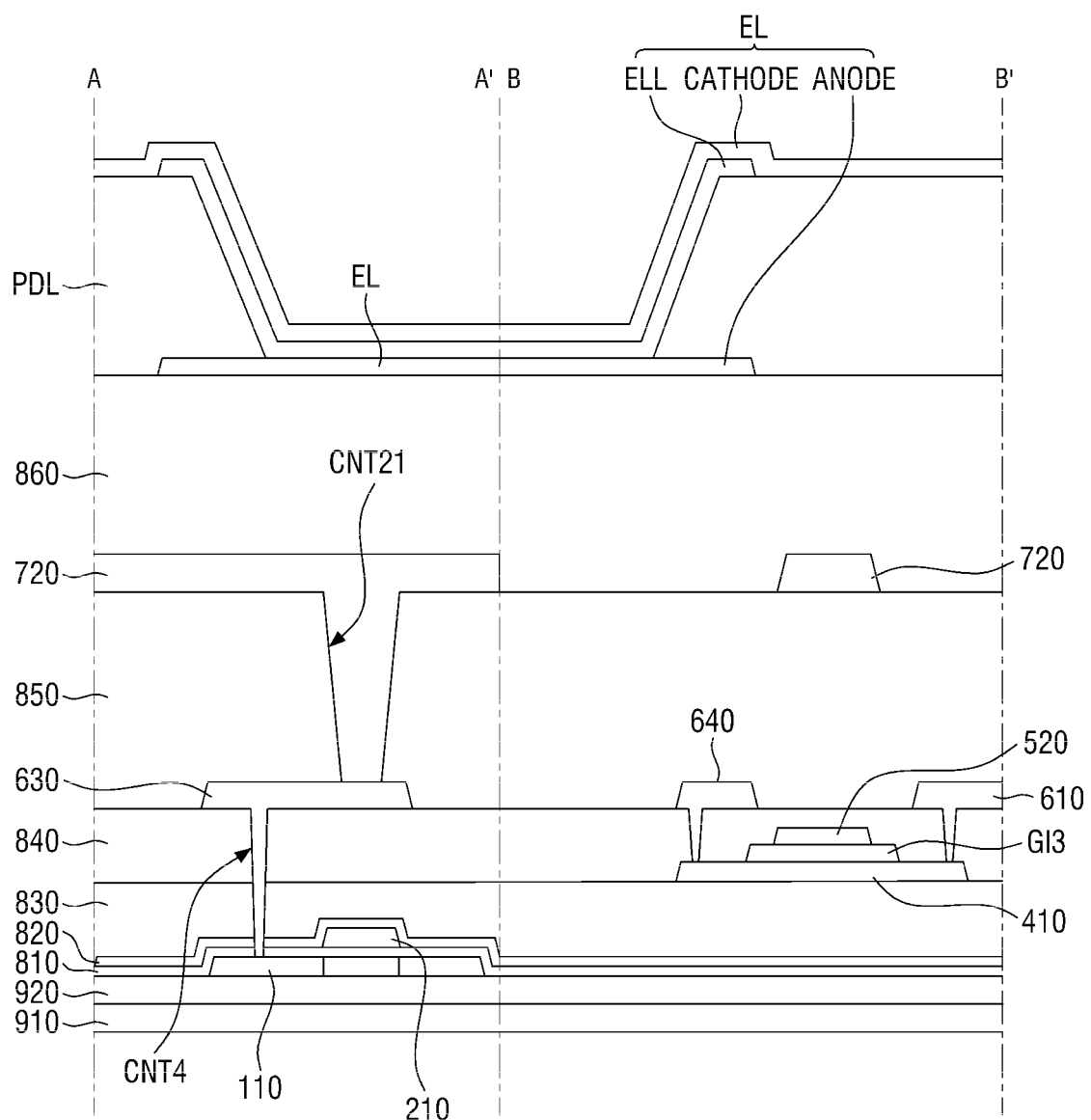
FIG. 5 is a cross-sectional view taken along the lines A-A' and B-B' of FIG. 4.
Figure 6:
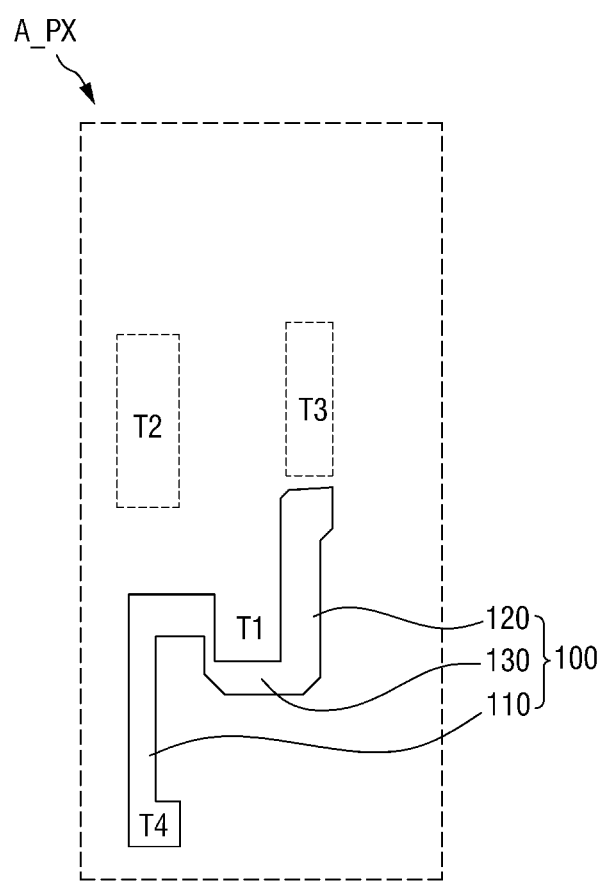
FIG. 6 is a view showing a lower semiconductor layer included in the pixel of FIG. 4.
Figure 7:
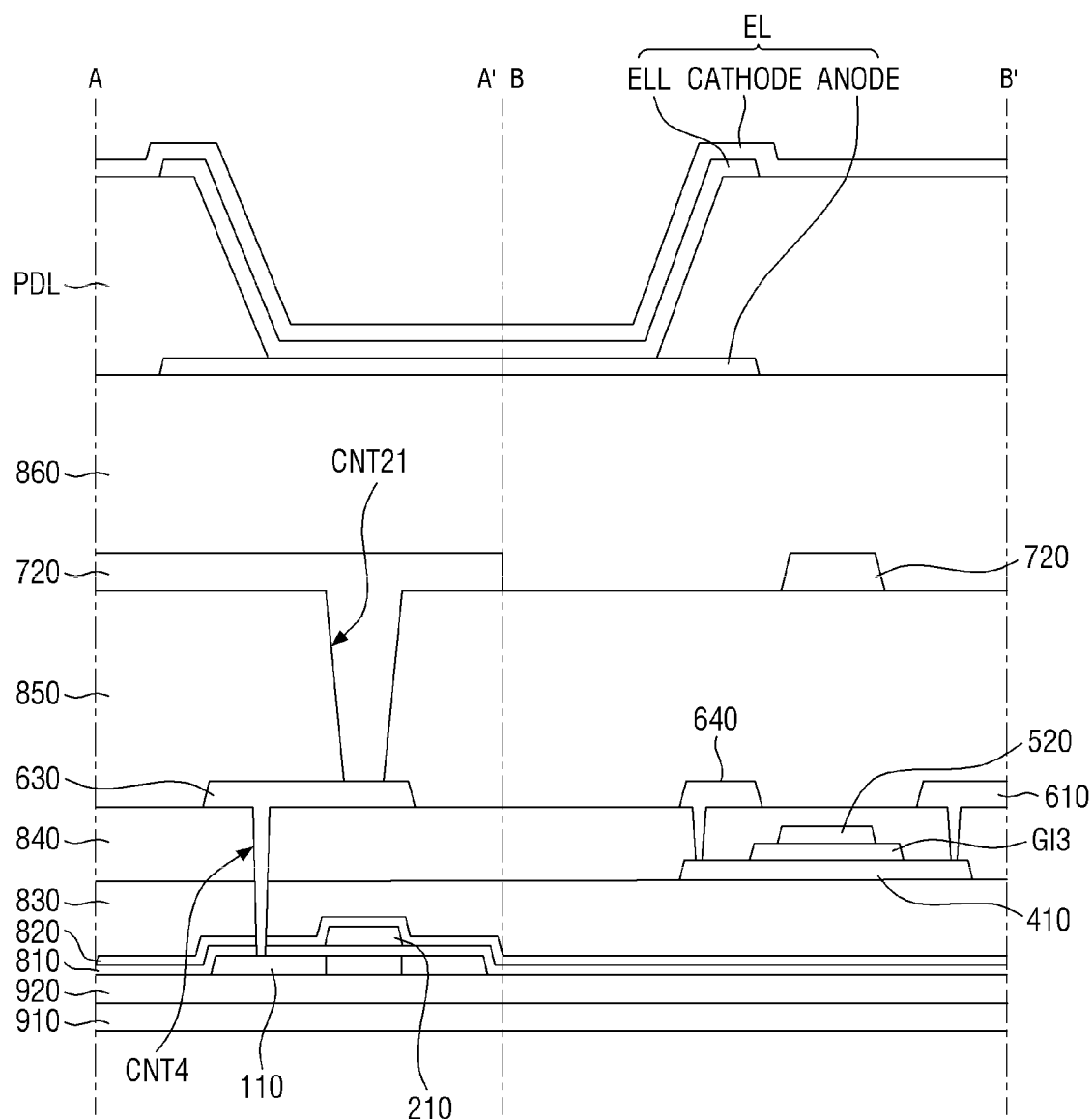
FIG. 7 is a view showing fourth and fifth conductive layers included in the pixel of FIG. 4.
Figure 8:
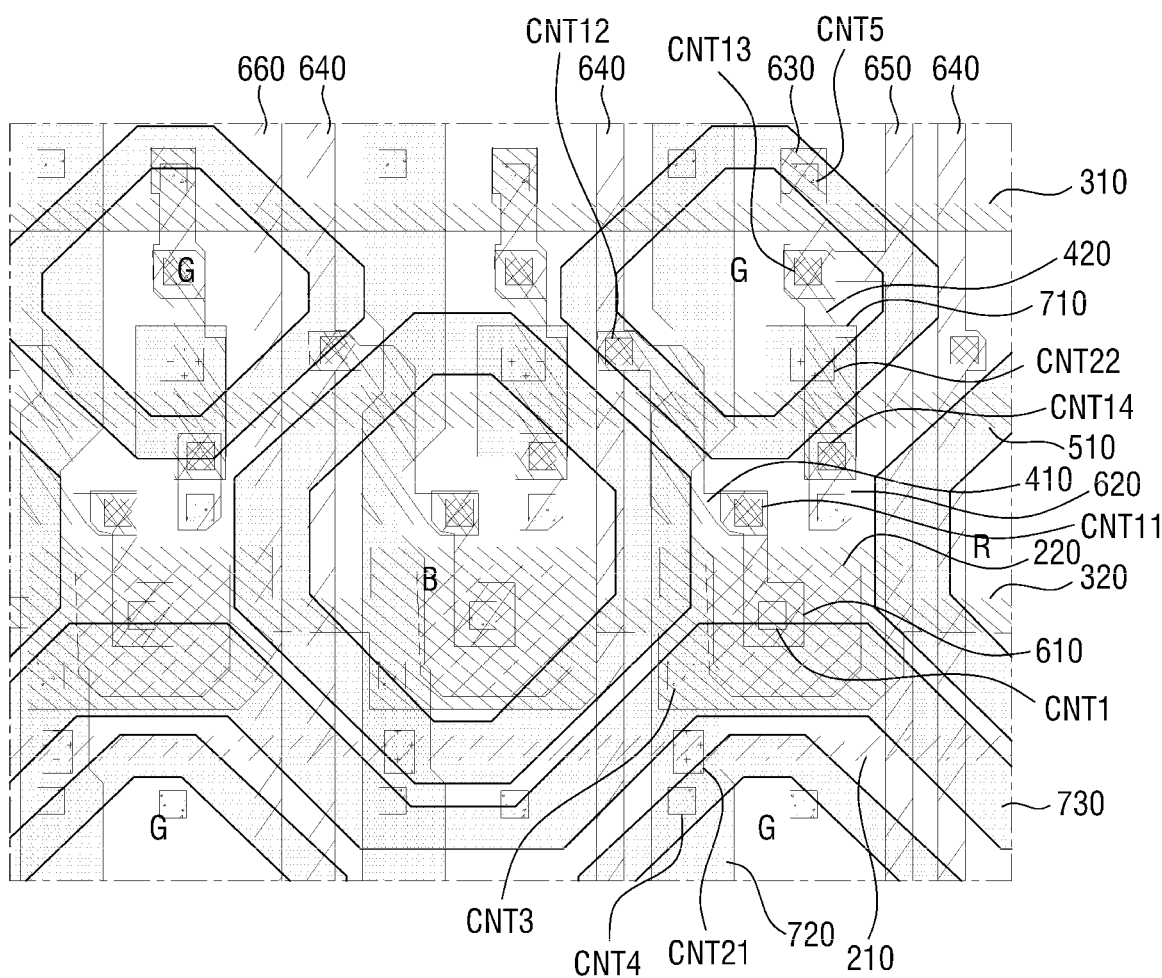
FIG. 8 is a view showing a light emitting element included in the pixel of FIG. 4.

FIG. 4 is a layout diagram of the pixels of FIG. 3. FIG. 5 is a cross-sectional view taken along the lines A-A' and B-B' of FIG. 4. FIG. 6 is a view showing a lower semiconductor layer included in the pixel of FIG. 4. FIG. 7 is a view showing fourth and fifth conductive layers included in the pixel of FIG. 4. FIG. 8 is a view showing a light emitting element included in the pixel of FIG. 4.

In the following embodiments, although some components are substantially the same as the components mentioned in FIGS. 1 and 2, new reference numerals have been given to facilitate the description of the arrangement and coupling relationship among the components.

Referring to FIGS. 3 to 8, the pixel PX may include first to fourth transistors T1 to T4, a storage capacitor CST, and a light emitting element EL.

The first to fourth transistors T1 to T4 may include a conductive layer forming an electrode, a semiconductor layer forming a channel, and an insulating layer. The first to fourth transistors T1 to T4 may be top gate-type transistors in which a gate electrode is disposed above a semiconductor layer.

The storage capacitor CST may include conductive layers constituting electrodes and an insulating layer disposed between the conductive layers. The light emitting element EL may include conductive layers constituting an anode electrode and a cathode electrode and an organic light emitting layer disposed between the conductive layers. The electrical connection between the components may be made by a wiring formed of a conductive layer and/or a via formed of a conductive material. The above-described conductive layer, semiconductor layer, insulating layer, organic light emitting layer, and the like are disposed on a substrate 810.

The pixel PX may include a substrate 910, a buffer layer 920, a lower semiconductor layer 100, a first insulating layer 810, a first conductive layer 200, a second insulating layer 820, a second conductive layer 300, a third insulating layer 830, an upper semiconductor layer 400, a third conductive layer 500, a fourth insulating layer 840, a fourth conductive layer 600, a fifth insulating layer 850, and a fifth conductive layer 700. The substrate 910, the buffer layer 920, the lower semiconductor layer 100, the first insulating layer 810, the first conductive layer 200, the second insulating layer 820, the second conductive layer 300, the third insulating layer 830, the upper semiconductor layer 400, the third conductive layer 500, the fourth insulating layer 840, the fourth conductive layer 600, the fifth insulating layer 850, and the fifth conductive layer 700 may be sequentially arranged or laminated. Meanwhile, the lower semiconductor layer 100, the first insulating layer 810, the first conductive layer 200, the second insulating layer 820, the second conductive layer 300, the third insulating layer 830, the upper conductive layer 400, and the third conductive layer 500 may be referred to as a driving circuit layer (that is, a layer in which transistors are formed).

Each of the above-described layers may be formed of a single film, but may also be formed of a laminate film including a plurality of films. Another layer may be further disposed between the respective layers.

The substrate 910 supports layers disposed thereon. When the display device 1 is a back-sided or double-sided emission type display device, a transparent substrate may be used. When the display device 1 is a front-sided emission type display device, a translucent or opaque substrate as well as a transparent substrate may be used.

The substrate 910 may be formed of an insulating material such as glass, quartz, or a polymer resin. Examples of the polymer resin may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), and combinations thereof. The substrate 910 may include a metallic material.

The substrate 910 may be a rigid substrate or a flexible substrate capable of bending, folding, rolling, and the like. An example of the material constituting the flexible substrate is polyimide (PI), but is not limited thereto.

The buffer layer 920 may be disposed on the entire surface of the substrate 910. The buffer layer 920 may prevent the diffusion of impurity ions, may prevent the penetration of moisture or external air, and may perform a surface planarization function. The buffer layer 920 may include silicon nitride, silicon oxide, and/or silicon oxynitride. The buffer layer 920 may be omitted depending on the type of the substrate 910, process conditions, and the like.

The lower semiconductor layer 100 is an active layer constituting channels of the first and fourth transistors T1 and T4. The lower semiconductor layers 100 may be separated from each other for each pixel, but is not limited thereto. For example, two adjacent pixels in the row direction may share one lower semiconductor layer 100.

The lower semiconductor layer 100 may include a first longitudinal portion 110 and a second longitudinal portion 120 extending in the substantially column direction, and may also include a transverse portion 130 extending in the substantially row direction. The first longitudinal portion 110, the second longitudinal portion 120, and the transverse portion 130 may be physically connected to form one lower semiconductor pattern.

The first longitudinal portion 110 may be disposed adjacent to the left side of the pixel and the second longitudinal portion 120 may be disposed adjacent to the right side of the pixel. The length of the first longitudinal portion 110 in the column direction may be longer than the length of the second longitudinal portion 120 in the column direction.

The transverse portion 130 may connect one end (for example, an upper end) of the first longitudinal portion 110 and the other end (for example, a lower end) of the second longitudinal portion 120.

The transverse portion 130 may connect the first vertical portion 110 and the second vertical portion 120 with the shortest distance, but may include bent portions at left and right sides thereof, as shown in FIG. 6. The total length of the transverse portion 130 may increase through multiple bending.

The channel of the first transistor T1 may be disposed at the transverse portion 130, and the channel of the fourth transistor T4 may be disposed at the first longitudinal portion 110.

The lower semiconductor layer 100 may include polycrystalline silicon. The polycrystalline silicon may be formed by crystallizing amorphous silicon. Examples of the crystallization method may include, but are not limited to, rapid thermal annealing (RTA), solid phase crystallization (SPC), excimer laser annealing (ELA), metal induced crystallization (MIC), metal induced lateral crystallization (MILC), and sequential lateral solidification (SLS). As another example, the lower semiconductor layer 100 may include single crystalline silicon, low-temperature polycrystalline silicon, or amorphous silicon.

In the lower semiconductor layer 100, a region (source/drain region) connected to the source/drain electrode of each of the first and fourth transistors may be doped with impurity ions (p-type impurity ions in the case of a PMOS transistor). As the p-type impurity ion, a trivalent dopant such as boron (B) may be used.

The first insulating layer 810 may be disposed on the lower semiconductor layer 100, and may be generally disposed over the entire surface of the substrate 910. The first insulating layer 810 may be a gate insulating film having a gate insulating function.

The first insulating layer 810 may include a silicon compound, a metal oxide, or the like. For example, the first insulating layer 810 may include silicon oxide, silicon nitride, silicon oxynitride, aluminum oxide, tantalum oxide, hafnium oxide, zirconium oxide, titanium oxide, or the like. These may be used alone or in combination with each other. The first insulating layer 810 may be a single film or a multilayer film composed of a laminate film of different materials.

The first conductive layer 200 is disposed on the first insulating layer 810. The first conductive layer 200 may include a light emission control line 210 for transmitting a light emission control signal EM and a gate electrode 220 of the first transistor T1. Here, the light emission control line 210 may be substantially the same as the light emission control lines EML1 to EMLn shown in FIG. 1.

The light emission control line 210 may be disposed below the pixel PX in a plan view. The light emission control line 210 may overlap the first longitudinal portion 110 of the lower semiconductor layer 100.

The gate electrode of the fourth transistor T4 may be formed in an overlap region where the light emission control line 210 overlaps the first longitudinal portion 110 of the lower semiconductor layer 100. The first longitudinal portion 110 of the lower semiconductor layer 100 located at the upper side of the overlap region may become a first electrode region of the fourth transistor T4, and the first longitudinal portion 110 of the lower semiconductor layer 100 located at the lower side of the overlap region may become a second electrode region of the fourth transistor T4.

The gate electrode 220 of the first transistor T1 may be located at the center of the pixel PX. The gate electrode 220 of the first transistor T1 may be located between the light emission control line 210 and the first scan line 510 to be described later. The gate electrode 220 of the first transistor T1 may be separated for each pixel, and may be disposed in an island shape.

The gate electrode 220 of the first transistor T1 may overlap the second longitudinal portion 120 and the transverse portion 130 of the lower semiconductor layer 100. The second longitudinal portion 120 of the lower semiconductor layer 100 located at the upper side of an overlap region where the gate electrode 220 of the first transistor T1 overlaps the transverse portion 130 of the lower semiconductor layer 100 may become a first electrode region of the first transistor T, and the transverse portion 130 (or the first longitudinal portion 110) located at the left side of the overlap region may become a second electrode region of the first transistor T1.

The first conductive layer 200 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 200 may be a single film or a multilayer film.

The second insulating layer 820 may be disposed on the first conductive layer 200, and may be disposed over the entire surface of the substrate 910. The second insulating layer 820 serves to insulate the first conductive layer 200 from the second conductive layer 300, and may be an interlayer insulating film.

The second insulating layer 820 may include an inorganic insulating material such as silicon oxide, silicon nitride, silicon oxynitride, hafnium oxide, aluminum oxide, titanium oxide, tantalum oxide, or zinc oxide, and/or may include an organic insulating layer such as polyacrylate resin, epoxy resin, phenolic resin, polyamide resin, polyimide rein, unsaturated polyester resin, polyphenylenether resin, polyphenylenesulfide resin, or benzocyclobutene (BCB). The second insulating layer 820 may be a single film or a multilayer film made of a laminate film of different materials.

The second conductive layer 300 is disposed on the second insulating layer 820. The second conductive layer 300 may include a horizontal sensing wiring 310 and an electrode line 320 of the storage capacitor CST. Here, the horizontal sensing wiring 310 may be substantially the same as the horizontal sensing wirings SH11 to SHnk shown in FIG. 1.

Each of the horizontal sensing wiring 310 and the electrode line 320 of the storage capacitor CST may extend along the row direction. Each of the horizontal sensing wiring 310 and the electrode line 320 of the storage capacitor CST may extend to a neighboring pixel beyond the boundary of the pixel PX along the row direction.

The horizontal sensing wiring 310 may be located at the uppermost side (or lowest side) of the pixel in a plan view.

The electrode line 320 of the storage capacitor CST may be disposed between the first scan line 510 and the light emission control line 210 in a plan view across the center of the pixel PX. The electrode line 320 of the storage capacitor CST may be disposed so as to overlap the gate electrode 220 of the first transistor T1 with the second insulating layer 820 interposed therebetween. The gate electrode 220 of the first transistor T1 may become a first electrode of the storage capacitor CST, the extending region of the electrode line 320 of the storage capacitor CST overlapping the first electrode of the storage capacitor CST may become a second electrode of the storage capacitor CST, and the second insulating layer 820 interposed therebetween may become a dielectric of the storage capacitor CST. The first power supply voltage ELVDD may be applied to the electrode line 320 of the storage capacitor CST.

In the region overlapping the gate electrode 220 of the first transistor T1, the storage capacitor electrode line 320 may have an extending width. The electrode line 320 of the storage capacitor CST may include an opening overlapping the gate electrode 220 of the first transistor T1 in the extending region.

The second conducive layer 300, similarly to the first conductive layer 200, may include at least one metal selected from molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu).

The third insulating layer 830 may be disposed on the second conductive layer 300 to cover the second conductive layer 300. The third insulating layer 830 may be generally disposed over the entire surface of the substrate 910. The third insulating layer 830 may be a gate insulating film having a gate insulating function. The third insulating layer 830 may include the same material as the first insulating layer 810, or may include at least one material selected from the exemplified constituent materials of the first insulating layer 810. The third insulating layer 830 may be a single film or a multilayer film composed of a laminate film of different materials.

The upper semiconductor layer 400 may be disposed on the third insulating layer 830. The upper semiconductor layer 400 may include first and second upper semiconductor patterns 410 and 420 separated from each other in the pixel PX.

The first upper semiconductor pattern 410 may be disposed to overlap the gate electrode of the second transistor T2 to form a channel of the second transistor T2. Similarly, the second upper semiconductor pattern 420 may be disposed to overlap the gate electrode of the third transistor T3 to form a channel of the third transistor T3. The first upper semiconductor pattern 410 may have a rectangular shape, but the shape thereof is not limited thereto.

The upper semiconductor layer 400 may include an oxide semiconductor. For example, the upper semiconductor layer 400 may include a two-component compound (ABx), a three-component compound (ABxCy), or a four-component compound (ABxCyDz), each selectively containing indium (In), zinc (Zn), gallium (Ga), tin (Sn), titanium (Ti), aluminum (Al), hafnium (Hf), zirconium (Zr), and magnesium (Mg). In an embodiment, the upper semiconductor layer 400 may include ITZO (an oxide containing indium, tin, and titanium) or IGZO (an oxide containing indium, gallium, and tin).

A gate insulating film GI3 may be disposed on the upper semiconductor layer 400. The gate insulating film GI3 may be disposed in a region where the upper semiconductor layer 400 overlaps the first scan line 510 to be described later. The gate insulating film GI3 may include the same material as the first insulating layer 810, or may include at least one material selected from the exemplified constituent materials of the first insulating layer 810.

The third conductive layer 500 may include a first scan line 510 for transmitting a first scan signal SCAN1. Further, the third conductive layer 500 may include gate wirings of the second and third transistors T2 and T3. Here, the first scan line 510 may be substantially the same as the scan lines SL11 to SLn1 shown in FIG. 1.

The first scan line 510 may extend along the row direction. The first scan line 510 may extend to a neighboring pixel beyond the boundary of the pixel PX along the row direction.

The first scan line 510 may be located above the electrode line 320 of the storage capacitor CST in a plan view, and may be located below the horizontal sensing wiring 310 in a plan view. The first scan line 510 may include a gate electrode of the second transistor T2 and a gate electrode of the third transistor T3. The gate electrode of the second transistor T2 and the gate electrode of the third transistor T3 may be wider than the peripheral line, but the present inventive concept is not limited thereto.

Meanwhile, although it is shown in FIG. 4 that the third conductive layer 500 includes the first scan line 510, this corresponds to a case where the first scan signal SCAN1 and the second scan signal SCAN2, having been described with reference to FIG. 3, are the same as each other. When the first scan signal SCAN1 and the second scan signal SCAN2 are different from each other, the third conductive layer 500 may further include a second scan line in addition to the first scan line 510. The second scan line may be disposed between the horizontal sensing wiring 210 and the first scan line 510, or the second scan line may be disposed between the first scan line 510 and the electrode line 320 of the storage capacitor CST.

The third conducive layer 500 may include at least one metal selected from molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The third conductive layer 500 may be a single film or a multilayer film. For example, the third conductive layer 500 may have a laminate structure of Ti/Al/Ti, Mo/Al/Mo, Mo/AlGe/Mo, or Ti/Cu.

The fourth insulating layer 840 may be disposed on the third conductive layer 500, and may be disposed over the entire surface of the substrate 910. The fourth insulating layer 840 may be an interlayer insulating film for insulating the third conductive layer 500 from the fourth conductive layer 600. The fourth insulating layer 840 may include the same material as the second insulating layer 820, or may include at least one material selected from the constituent materials that the second insulating layer 820 may be selected from, listed above. The fourth insulating layer 840 may be a single film or a multilayer film made of a laminate film of different materials.

The fourth conductive layer 600 is disposed on the fourth insulating layer 840. The fourth conductive layer 600 may include first to third data patterns 610, 620 and 630, a data line 640, a vertical sensing line 650, and an auxiliary voltage line 660. Here, the data line 640 may be substantially the same as the data lines DL1 to DLm shown in FIG. 1, the vertical sensing wiring 650 may be substantially the same as the vertical sensing wiring SV1 to SVk shown in FIG. 1, and the auxiliary voltage wiring 660 may be substantially the same as the auxiliary voltage wiring DML1 to DMLj shown in FIG. 1.

The first to third data patterns 610, 620, 630 may be physically spaced apart from one another. Each of the first to third data patterns 610, 620 and 630 may electrically connect portions away from one another between the first to third transistors T1, T2 and T3, and may constitute a first or second electrode of a transistor including an oxide semiconductor (for example, the third transistor T3). When the fourth conductive layer 600 overlaps the upper semiconductor layer 400, the fourth conductive layer 600 may be in direct contact with the upper surface of the upper semiconductor layer 400 or may be in contact with the upper surface of the upper semiconductor layer 400 through an ohmic contact layer.

The first data pattern 610 may overlap the gate electrode 220 of the first transistor T1. A first contact hole CNT1 penetrating the fourth insulating layer 840, the third insulating layer 830, and the second insulating layer 820 to expose the gate electrode 220 of the first transistor T1 may be formed in an overlap region (that is, a region where the first data pattern 610 overlaps the gate electrode 220 of the first transistor T1). The first data pattern 610 may be electrically connected to the gate electrode 220 of the first transistor T1 through the first contact hole CNT1.

The first contact hole CNT1 may be formed in the opening of the electrode line 320 of the storage capacitor CST. In the first contact hole CNT1, the first data pattern 610 and the electrode line 320 of the storage capacitor CST adjacent to the first data pattern 610 may be insulated from each other through the third insulating layer 830.

The first data pattern 610 may extend upward from an overlap region with the gate electrode 220 of the first transistor T1, and may overlap the first upper data pattern 410.

In the overlap region where first data pattern 610 overlaps the first upper data pattern 410, an eleventh contact hole CNT11 penetrating the fourth insulating layer 840 to expose the first upper data pattern 410 may be formed, and the first data pattern 610 may be electrically connected to the first electrode region of the second transistor T2 through the eleventh contact hole CNT11, or a part of the first data pattern 610 overlapping the first upper semiconductor pattern 410 may constitute a first electrode region of the second transistor T2.

The second data pattern 620 may overlap the second longitudinal portion 120 of the lower semiconductor layer 100. In a region where the second data pattern 620 overlaps the second longitudinal portion 120 of the lower semiconductor layer 100, a second contact hole CNT2 penetrating the first to third insulating layers 810, 820, and 830 to expose the second longitudinal portion 120 of the lower semiconductor layer 100 may be formed. The second data pattern 620 may be electrically connected to the second electrode of the first transistor T1 through the second contact hole CNT2.

The second data pattern 620 may extend upward, and may overlap the second upper semiconductor pattern 420. In an overlap region where the second data pattern 620 overlaps the second upper semiconductor pattern 420, a fourteenth contact hole CNT14 penetrating the fourth insulating layer 840 to expose the second upper data pattern 420 may be formed, and the second data pattern 620 may be electrically connected to the first electrode region of the third transistor T3 through the fourteenth contact hole CNT14, or a part of the second data pattern 620 overlapping the second upper semiconductor pattern 420 may constitute a first electrode region of the third transistor T3.

The third data pattern 630 may overlap the second upper semiconductor pattern 420. In an overlap region where the third data pattern 630 overlaps the second upper semiconductor pattern 420, a thirteenth contact hole CNT13 penetrating the fourth insulating layer 840 to expose the second upper data pattern 420 may be formed, and the third data pattern 630 may be electrically connected to the second electrode region of the third transistor T3 through the thirteenth contact hole CNT13, or a part of the third data pattern 630 overlapping the second upper semiconductor pattern 420 may constitute a second electrode region of the third transistor T3.

The third data pattern 630 may extend upward, and may overlap a protrusion of the horizontal sensing wiring 310. In an overlap region with the protrusion of the horizontal sensing wiring 310, a fifth contact hole CNT5 penetrating the third and fourth insulating layers 830 and 840 to expose the protrusion of the horizontal sensing wiring 310 may be formed. The third data pattern 630 may be electrically connected to the horizontal sensing wiring 310 through the fifth contact hole CNT5.

The data wiring 640 may include a protrusion overlapping the first upper semiconductor pattern 410. The width of the protrusion of the data wiring 640 may be larger than the average width of the data wiring 640. A twelfth contact hole CNT12 penetrating the fourth insulating layer 840 to expose the first upper semiconductor pattern 410 (or the second data pattern 620) may be formed in the protrusion of the data wiring 640 (or a region where the data wiring 640 overlaps the first upper semiconductor pattern 410). The data wiring 640 may be electrically connected to the first upper semiconductor pattern 410 through the twelfth contact hole CNT12.

The vertical sensing wiring 650 may include a body 651 and a protrusion 652.

The body 651 of the vertical sensing wiring 650 may extend in the column direction between the pixel PX and another pixel adjacent to the pixel PX, and the protrusion 652 thereof may protrude from the body 651 in the row direction and overlap the third data pattern 630. The vertical sensing wiring 650 may be electrically connected to the third data pattern 630. In this case, the vertical sensing wiring 650 may be connected to the horizontal sensing wiring 310 through the third data pattern 630.

The auxiliary voltage wiring 660 may extend in the vertical direction, may be spaced apart from the sensing wiring 620 in the horizontal direction by a specific interval (for example, an interval corresponding to two pixels), and may be disposed between the pixels.

The auxiliary voltage wiring 660 may not be connected to the third data pattern 630. In FIG. 4, the auxiliary voltage wiring 660 may not include a configuration corresponding to the protrusion 621 of the vertical sensing wiring 650.

The fourth conducive layer 600 may include at least one metal selected from molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The fourth conducive layer 600 may be a single film or a multilayer film. For example, the fourth conducive layer 600 may have a laminate structure of Ti/Al/Ti, Mo/Al/Mo, Mo/AlGe/Mo, or Ti/Cu.

The fifth insulating layer 850 may be disposed on the fourth conducive layer 600, and may be disposed over the entire surface of the substrate 910. The fifth insulating layer 850 may insulate the fourth conductive layer 600 from the fifth conducive layer 700. The fifth insulating layer 850 may include the same material as the second insulating layer 820, or may include at least one material selected from the exemplified constituent materials of the second insulating layer 820. The fifth insulating layer 850 may be a single film or a multilayer film made of a laminate film of different materials.

The fifth conducive layer 700 is disposed on the fifth insulating layer 850. The fifth conducive layer 700 may include a via electrode 710 and first vertical and horizontal power supply voltage wirings 720 and 730. Here, the first vertical and horizontal power supply voltage wirings 720 and 730 may be included in the first power supply voltage wiring having been described with reference to FIG. 2.

The via electrode 710 may overlap the second data pattern 620. A twenty second contact hole CNT22 penetrating the fifth insulating layer 850 to expose the second data pattern 620 may be formed in a region where the via electrode 710 overlaps the second data pattern 620. In this case, the via electrode 720 may be electrically connected to the second data pattern 620 through the twenty second contact hole CNT22, and may be electrically connected to the first electrode of the first transistor T1 through the twelfth contact hole CNT12.

The first vertical power supply voltage wiring 720 may extend in the vertical direction and may be disposed adjacent to the data wiring 640, but may not overlap the data wiring 640. Further, the first vertical power supply voltage wiring 720 may extend to a neighboring pixel beyond the boundary of the pixel along the column direction.

The first vertical power supply voltage wiring 720 may overlap the first longitudinal portion 110 of the lower semiconductor layer 100 (or the first electrode region of the fourth transistor T4). In an overlap region where the first vertical power supply voltage wiring 720 overlaps the lower end of the first longitudinal portion 110 of the lower semiconductor layer 100, a fourth contact hole CNT4 penetrating the first to third insulating layers 810, 820, and 830 to expose the lower end of the first longitudinal portion 110 of the lower semiconductor layer 100 may be formed. Furthermore, a twenty first contact hole CNT21 penetrating the fourth and fifth insulating layers 840 and 850 may be formed in the overlap region. The first vertical power supply voltage wiring 720 may be electrically connected to the first electrode region of the fourth transistor T4 through the fourth contact hole CNT4 and the twenty first contact hole CNT21.

The first vertical power supply voltage wiring 720 may partially decrease along the row direction, and may not overlap the first data pattern 610, the second data pattern 620, and the gate electrode 220 of the first transistor T1.

The first horizontal power supply voltage wiring 730 may extend substantially in the row direction, and may be disposed to partially overlap the light emission control line 210. The first horizontal power supply voltage wiring 730 may have a zigzag pattern (or a pattern including concave and convex portions) along the edge of the light emitting element EL shown in FIG. 8, and may not overlap the light emitting element EL.

Further, the first horizontal power supply voltage wiring 730 may extend to a neighboring pixel beyond the boundary of the pixel along the row direction.

In an overlap region where the first vertical power supply voltage wiring 720, the first horizontal power supply voltage wiring 730, and the electrode line 320 of the storage capacitor CST overlap each other, a third contact hole CNT3 penetrating the second to fifth insulating layers 820, 830, 840, and 850 to expose the electrode line 220 of the storage capacitor CST may be formed, and the first vertical power supply voltage wiring 720 (or the first horizontal power supply voltage wiring 730) may be electrically connected to the electrode line 320 of the storage capacitor CST through the third contact hole CNT3.

The fifth conducive layer 700 may include at least one metal selected from molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The fifth conducive layer 700 may be a single film or a multilayer film. For example, the fifth conducive layer 700 may have a laminate structure of Ti/Al/Ti, Mo/Al/Mo, Mo/AlGe/Mo, or Ti/Cu.

The sixth insulating layer 860 may be disposed on the fifth conductive layer 700, and may be disposed over the entire surface of the substrate 910. The sixth insulating layer 860 may insulate the fifth conductive layer 700 from the light emitting element EL. The sixth insulating layer 860 may include the same material as the second insulating layer 820, or may include at least one material selected from the exemplified constituent materials of the second insulating layer 820. The sixth insulating layer 860 may be a single film or a multilayer film made of a laminate film of different materials.

The anode electrode ANODE of the light emitting element EL may be disposed on the sixth insulating layer 860. The anode electrode ANODE may overlap the via electrode 710. In a region where the anode electrode ANODE overlaps the via electrode 710, a contact hole penetrating the sixth insulating layer 860 to expose the via electrode 710 may be formed, and the anode electrode ANODE may be electrically connected to the via electrode 710 through the contact hole.

A pixel defining layer PDL is disposed along the edge of the anode electrode ANODE, and a light emitting layer ELL may be disposed on the anode electrode ANODE and the pixel defining layer PDL. The cathode electrode CATHODE of the light emitting element EL may be disposed on the light emitting layer ELL.

As described above with reference to FIGS. 4 to 8, each of the first and fourth transistors T1 and T4 may include a polycrystalline silicon semiconductor, and each of the second and third transistors T2 and T3 may include an oxide semiconductor. The vertical sensing wiring 650 may be electrically connected to the second electrode of the fourth transistor T4 through the protrusion 652, and may be electrically connected to the horizontal sensing wiring 310. The auxiliary voltage wiring 660 may be disposed corresponding to the vertical sensing wiring 650, but may not be electrically connected to the second electrode of the fourth transistor T4.

Meanwhile, although it is shown in FIG. 5 that the first to fourth transistors T1 to T4 are top gate type transistors, the present inventive concept is not limited thereto. For example, the first and fourth transistors T1 and T4 may be top gate type transistors, and the second and third transistors T2 and T3 may be bottom gate type transistors where a gate electrode is disposed below a semiconductor layer. In this case, the first scan line 510 (that is, the first scan line 510 including gates electrodes of the second and third transistors T2 and T3) may be included in the second conductive layer 300 instead of the third conductive layer 500, and may be disposed on the second insulating layer 820.

Figure 9:
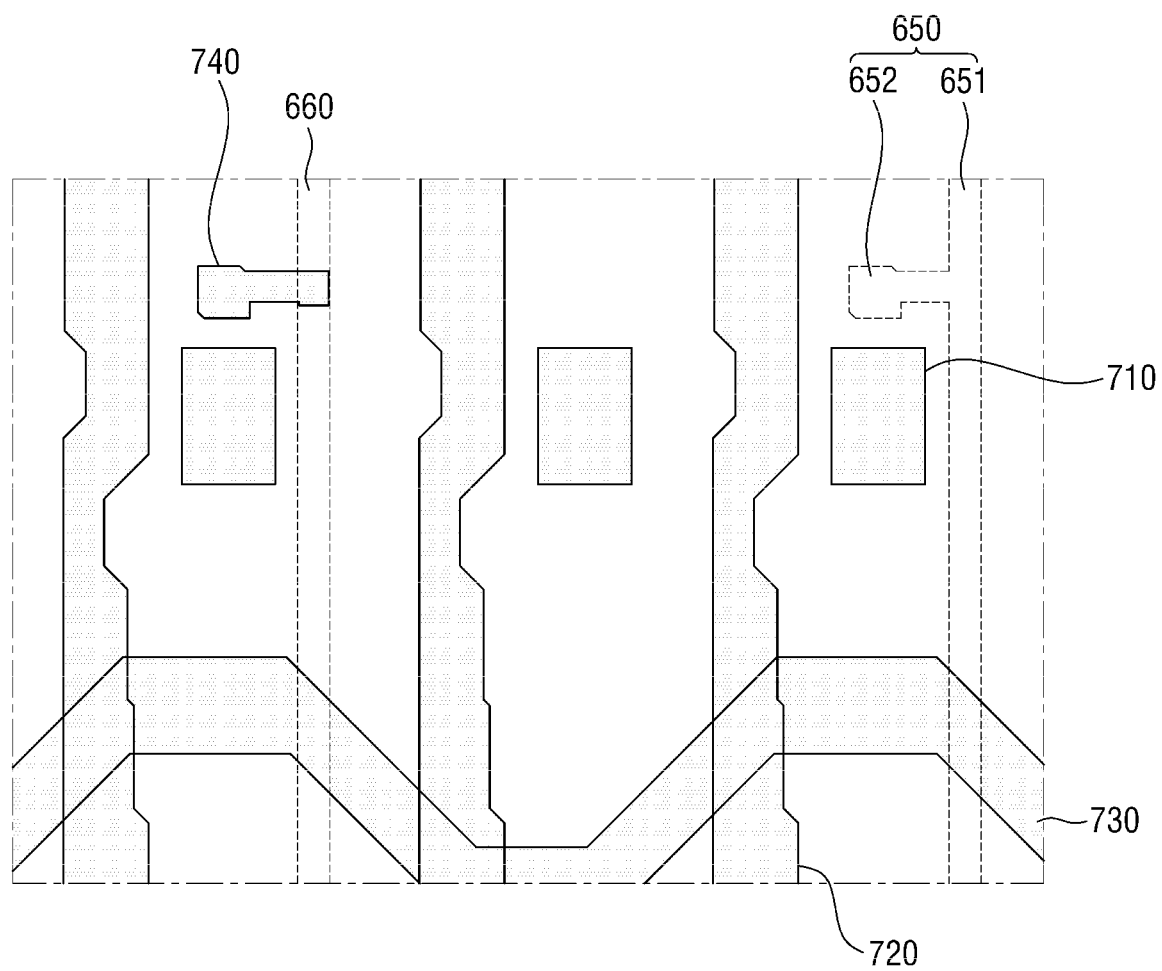
FIG. 9 is a view showing another example of the fifth conductive layer included in the pixel of FIG. 4.

FIG. 9 is a view showing another example of the fifth conductive layer included in the pixel of FIG. 4.

Referring to FIGS. 4, 7 and 9, the fifth conductive layer 700 may further include a protruding pattern 740 (or a conductive pattern).

The protruding pattern 740 may have substantially the same shape as the protruding portion 652 of the vertical sensing wiring 650, and may overlap the auxiliary voltage wiring 660 and the third data pattern 630.

The protruding pattern 740 may be connected to only one selected from the auxiliary voltage wiring 660, the third data pattern 630, and the via electrode 710, and may not be connected to the rest of the non-selected of the auxiliary voltage wiring 660, the third data pattern 630, and the via electrode 710.

For example, the protruding pattern 740 may not be electrically connected to the auxiliary voltage wiring 660, and the protruding pattern 740 and the auxiliary voltage wiring 660 may be insulated from each other through the fifth insulating layer 850. In this case, the protruding pattern 740 may be electrically connected to the third data pattern 630 through a separate contact hole.

As another example, the protruding pattern 740 may be electrically connected to the auxiliary voltage wiring 660 through a separate contact hole, but may not be electrically connected to the third data pattern 630.

In this case, the pixel regions have a mutually similar layout in a plan view, so that the pixels may have mutually similar characteristics.

Figure 10:
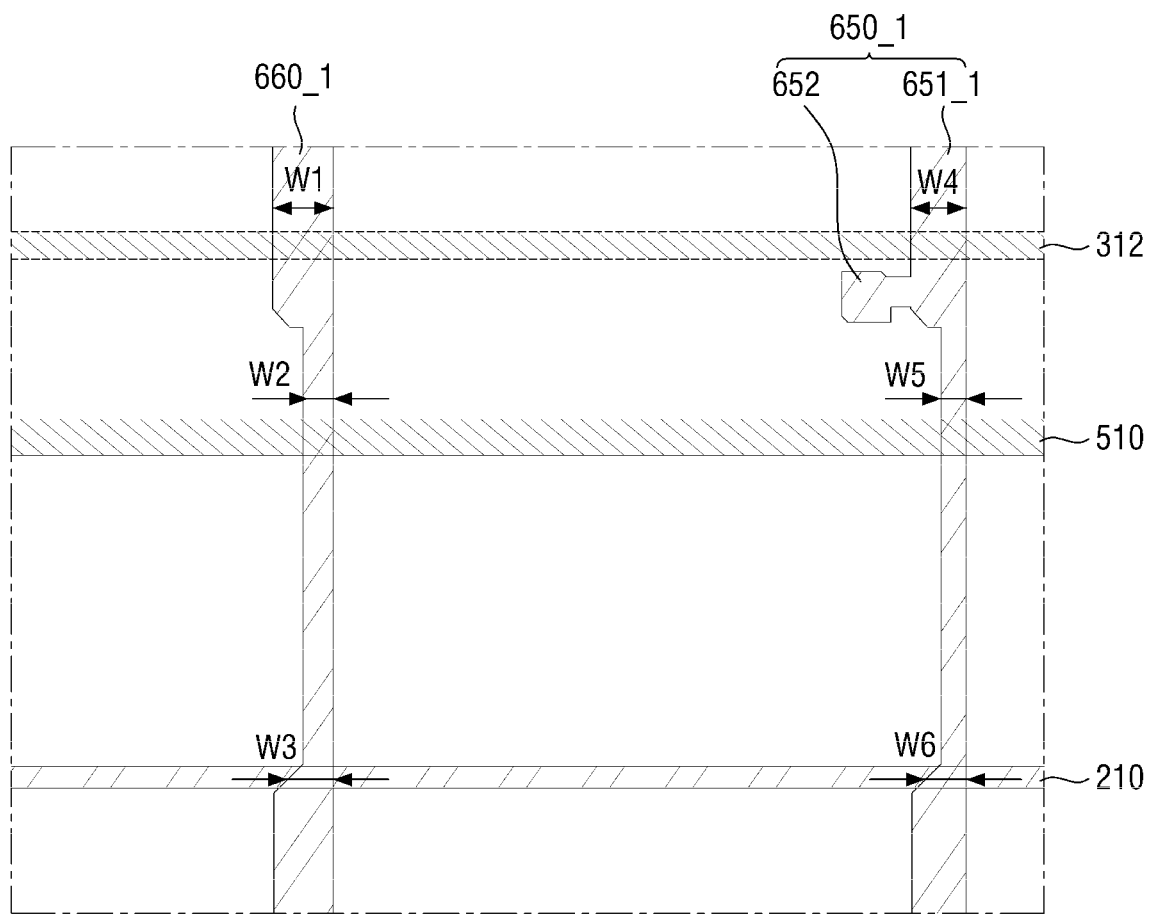
FIG. 10 is a layout diagram showing another example of the auxiliary voltage wiring included in the pixel of FIG. 4.

FIG. 10 is a layout diagram showing another example of the auxiliary voltage wiring included in the pixel of FIG. 4.

Referring to FIGS. 8 and 10, an auxiliary voltage wiring 660_1 is different from the auxiliary voltage wiring 660 having been described with reference to FIGS. 4 and 8 in that the width of the auxiliary voltage wiring 660_1 is changed along the row direction.

In the first overlap region overlapping the horizontal sensing wiring 310, the first width W1 of the auxiliary voltage wiring 660_1 may be greater than the average width of the auxiliary voltage wiring 660_1. In the second overlap region overlapping the first scan line 510, the second width W2 of the auxiliary voltage wiring 660_1 may be smaller than the average width of the auxiliary voltage wiring 660_1. In the third overlap region overlapping the light emission control line 210, the third width W3 of the auxiliary voltage wiring 660_1 may be similar or the same as to the average width of the auxiliary voltage wiring 660_1 or may be equal to the first width W 1. The first width W1 of the auxiliary voltage wiring 660_1 may be equal to or greater than the third width W3, and the third width W3 may be greater than the second width W2. However, the first width W1 of the auxiliary voltage wiring 660_1 is smaller than the width (or length) of the protrusion 652 of the sensing wiring 650_1, and the auxiliary voltage wiring 660_1 may not overlap the third data pattern 63 or may not be connected to the third data pattern 63.

The third transistor T3 is formed on the first scan line 510, and the via electrode 710 is formed for connection to the light emitting element EL, so that the second width W2 of the auxiliary voltage wiring 660 may be relatively small.

When the auxiliary voltage wiring 660_1 is connected in parallel with the first power supply voltage wiring (or the first vertical power supply voltage wiring 720), the resistance of the first power supply voltage wiring may be reduced, and the voltage drop of the first power supply voltage ELVDD may be further mitigated.

Meanwhile, the sensing wiring 650_1 may include a body 651_1, and the body 651_1 may have substantially the same shape as the auxiliary voltage wiring 660_1. That is, the fourth width W4 of the sensing wiring 650_1 in the first overlap region, the fifth width W5 of the sensing wiring 650_1 in the second overlap region, and the sixth width W6 of the sensing wiring 650_1 in the third overlap region may be equal to the first to third widths T1, T2, and T3 of the auxiliary voltage wiring 660_1, respectively.

Figure 11:
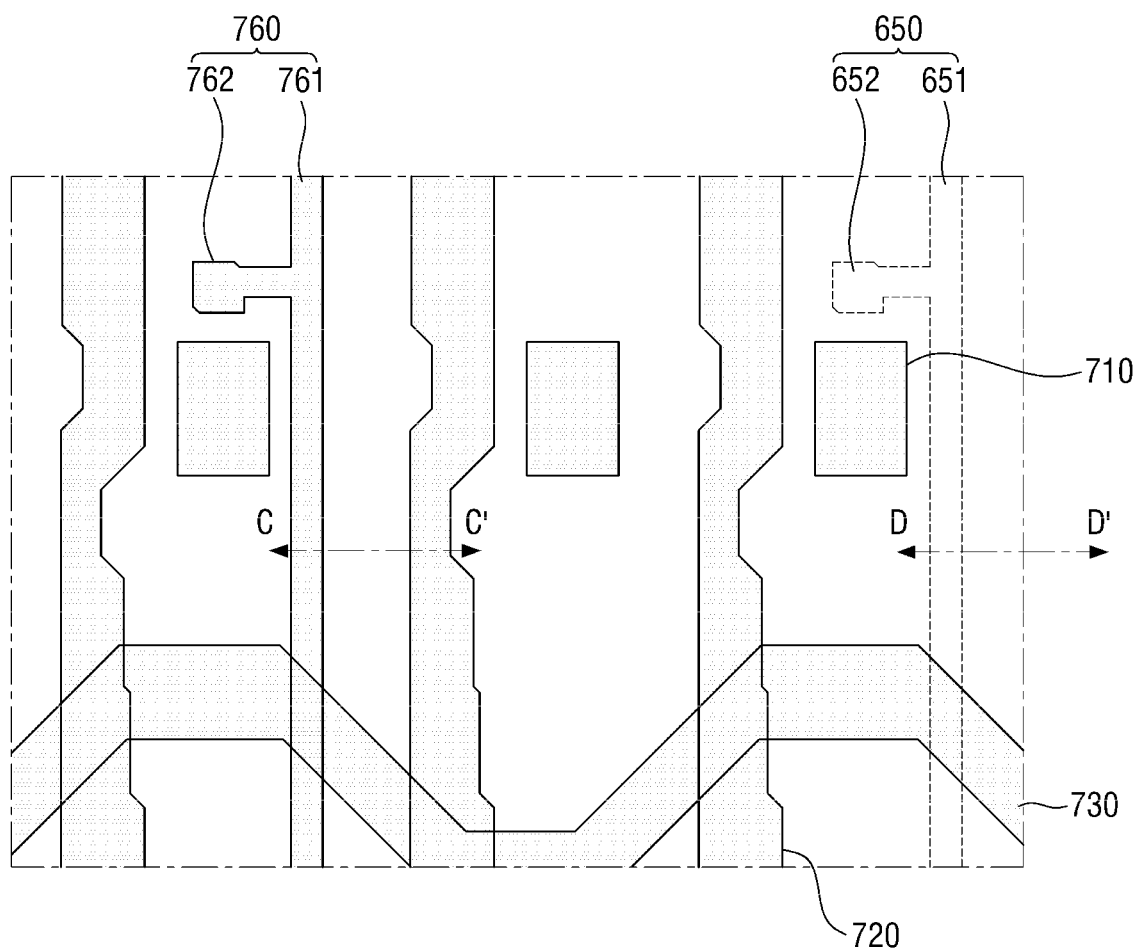
FIG. 11 is a layout diagram showing another example of the auxiliary voltage wiring included in the pixel of FIG. 4.
Figure 12:
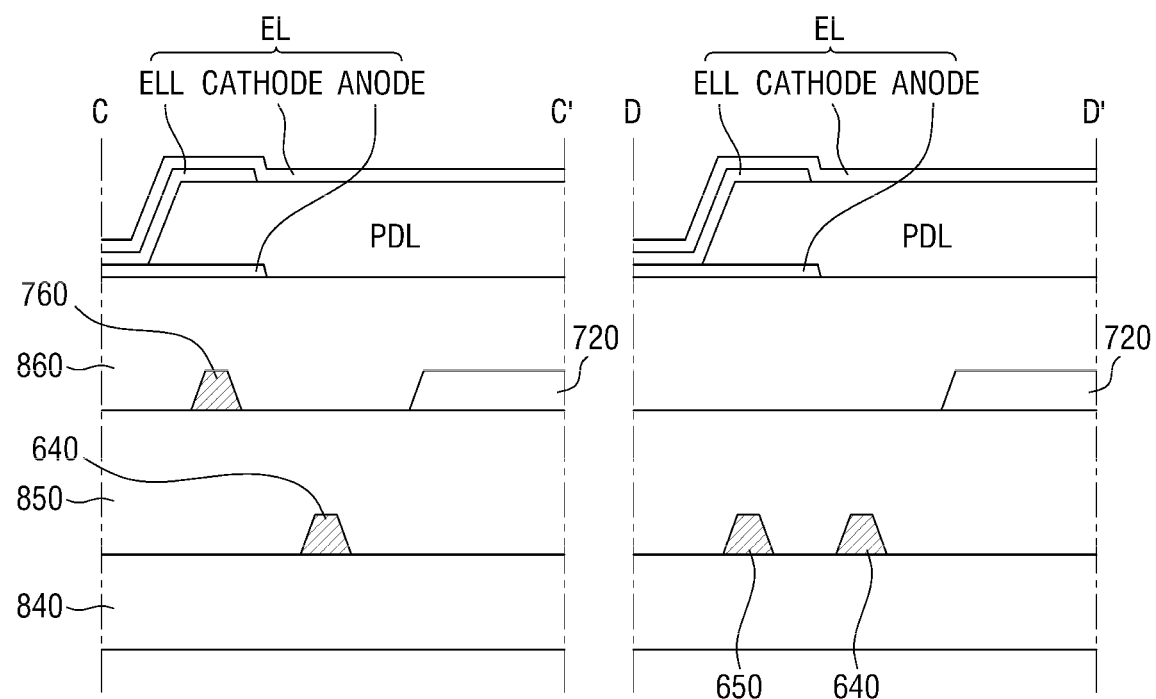
FIG. 12 is a cross-sectional view taken along the lines C-C' and D-D' of FIG. 11.

FIG. 11 is a layout diagram showing another example of the auxiliary voltage wiring included in the pixel of FIG. 4. FIG. 12 is a cross-sectional view taken along the lines C-C' and D-D' of FIG. 11.

Referring to FIGS. 4, 5, 11, and 12, an auxiliary voltage wiring 760 is different from the auxiliary voltage wiring 660 shown in FIG. 4 in that the auxiliary voltage wiring 760 includes a body 761 and a protrusion 762.

The body 761 may have the same shape as the body 651 of the sensing wiring 650, and the protrusion 762 may have the same shape as the protrusion 652 of the sensing wiring 650.

Further, the auxiliary voltage wiring 760 may be formed on the fifth conductive layer 700 (that is, a conductive layer on which the power supply voltage wiring is formed) different from the fourth conductive layer 600 on which the sensing wiring 650 is formed.

In this case, the influence of the auxiliary voltage wiring 760 on the characteristics of the pixel PX may be somewhat different from the influence of the sensing wiring 650, but the difference may be very slight depending on the thickness of the fifth insulating layer 850. Therefore, the pixel PX adjacent to the auxiliary voltage wiring 760 may have substantially the same characteristics as those of the pixel adjacent to the sensing wiring 650.

Figure 13:
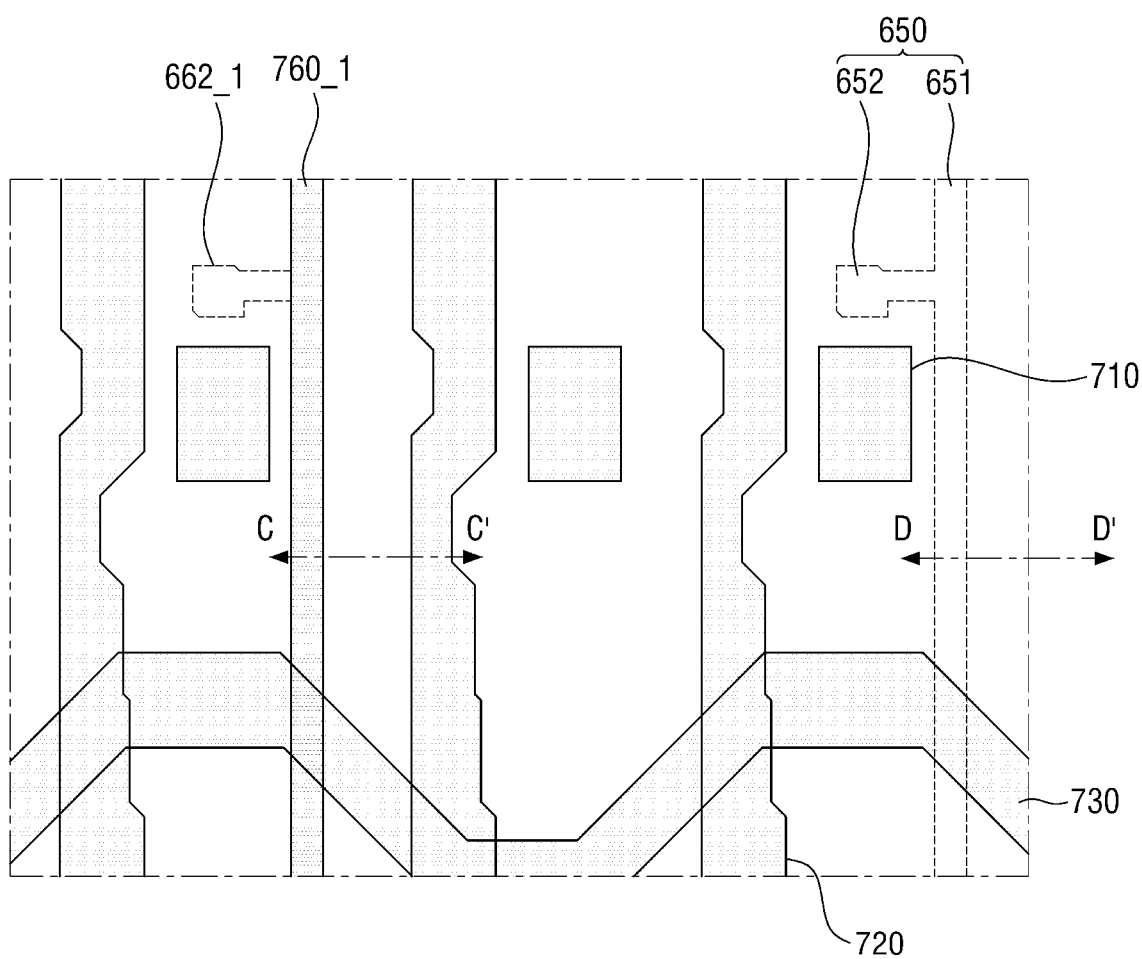
FIGS. 13, 14, and 15 are layout diagrams showing various embodiments of the auxiliary voltage wiring included in the pixel of FIG. 4.
Figure 14:
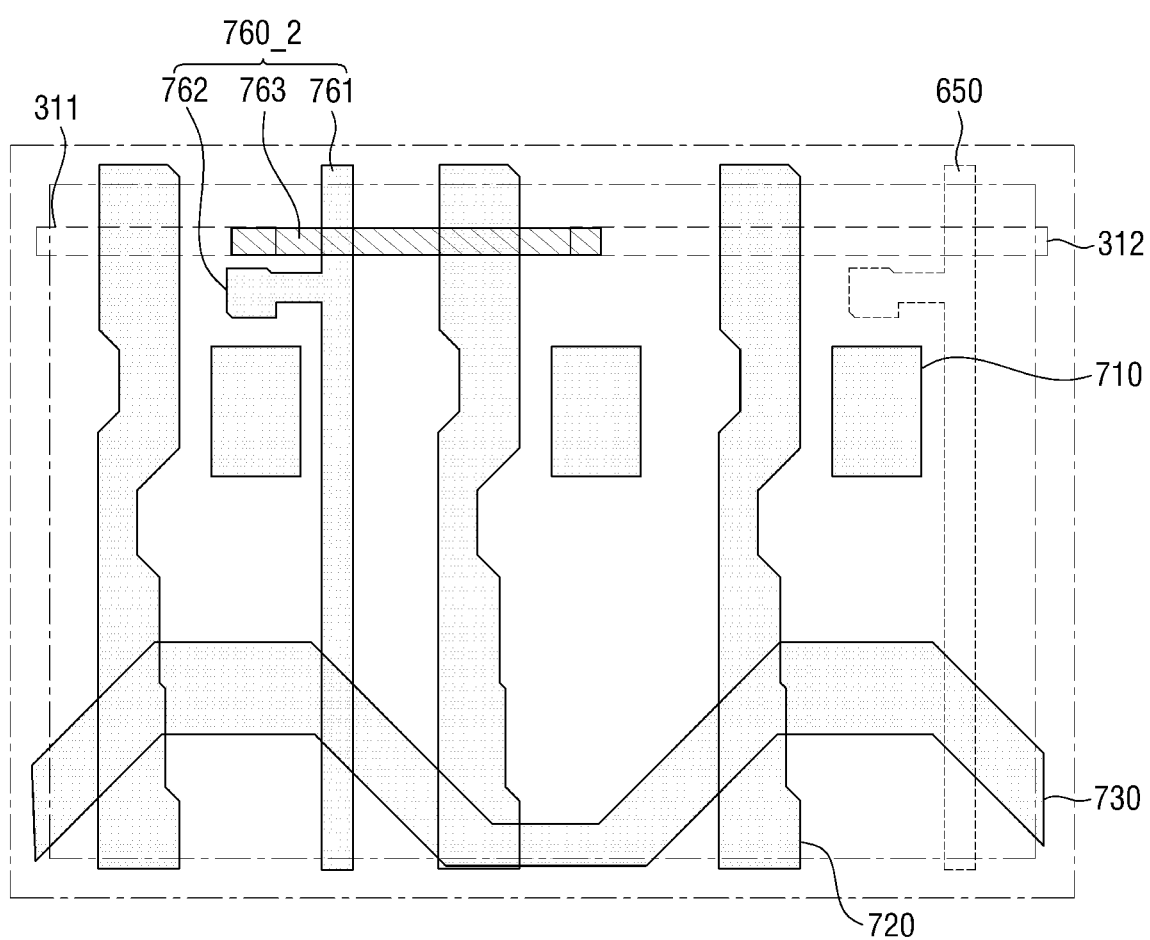
Figure 15:
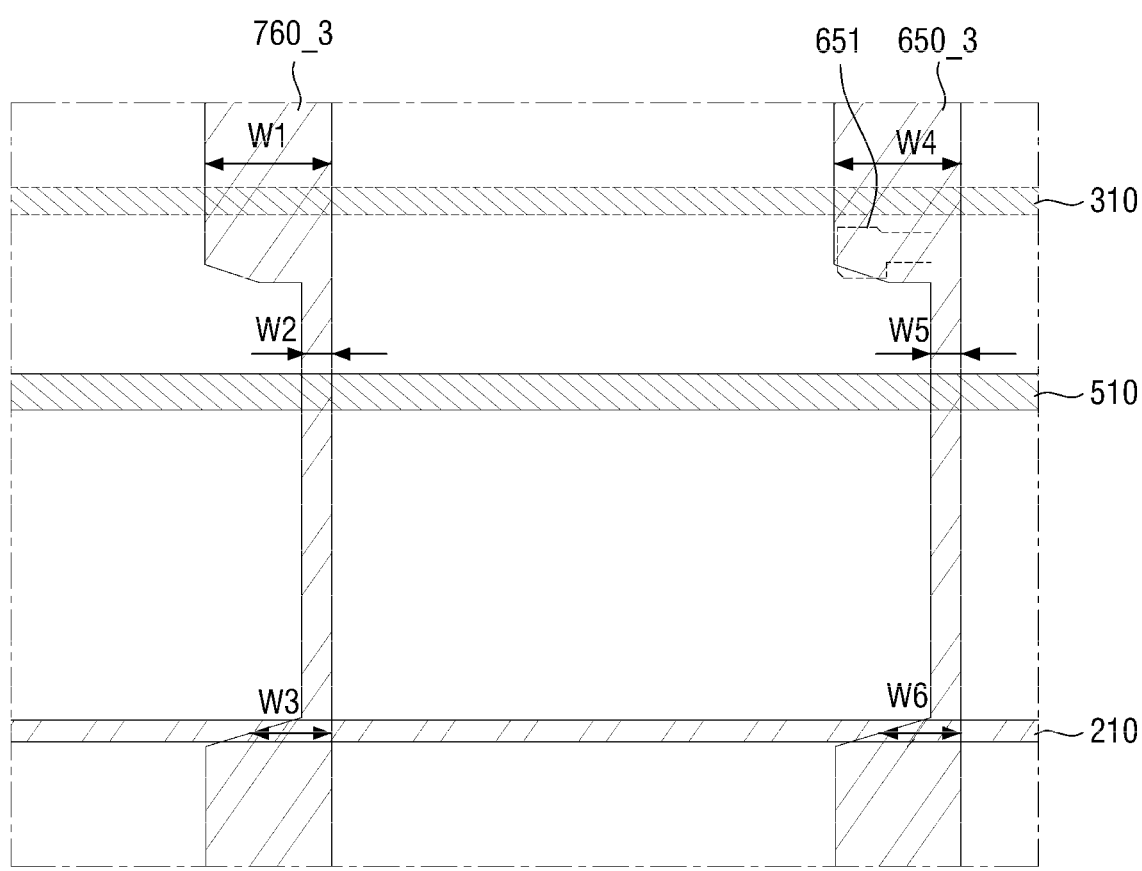

FIGS. 13 to 15 are layout diagrams showing various embodiments of the auxiliary voltage wiring included in the pixel of FIG. 4.

Referring to FIGS. 11 and 13, an auxiliary voltage wiring 760_1 is different from the auxiliary voltage wiring 760 of FIG. 11 in that the auxiliary voltage wiring 760_1 does not include the protrusion 762.

Meanwhile, a protruding pattern 662_1 corresponding to the protrusion 652 of the sensing wiring 650 (or the protrusion pattern 740 described with reference to FIG. 9) is formed to overlap the auxiliary voltage wiring 760_1, but the protruding pattern 662_1 may be formed on the fourth conductive layer 400. The protruding pattern 662_1 may be connected to the third data pattern 630.

That is, in a plan view, the auxiliary voltage wiring 760_1 and the protruding pattern 662_1 all have a similar shape to the sensing wiring 650, so that the pixel PX adjacent to the auxiliary voltage wiring 760_1 may have substantially the same characteristics as the pixel adjacent to the sensing wiring 650.

Referring to FIGS. 11 and 14, an auxiliary voltage wiring 760_2 is different from the auxiliary voltage wiring 760 of FIG. 11 in that the auxiliary voltage wiring 760_2 further includes a transverse portion 763.

As described above with reference to FIG. 1, in one row, horizontal sensing wirings (for example, eleventh to 1kth horizontal wirings SH11 to SH1k) may be arranged along the row direction to be spaced apart from each other.

As shown in FIG. 14, the horizontal sensing wiring 310 may include a first horizontal sensing wiring 311 and a second horizontal sensing wiring 312. The first horizontal sensing wiring 311 and the second horizontal sensing wiring 312 may be arranged on one line, and may be arranged to be spaced apart from each other in the row direction (or horizontal direction). The first horizontal sensing wiring 311 and the second horizontal sensing wiring 312 may be arranged in different directions from each other with respect to the body 761 of the auxiliary voltage wiring 760_2. For example, the eleventh horizontal sensing wiring SH11 shown in FIG. 1 may be disposed on one side (for example, left side) of the first auxiliary voltage wiring DML1, and the twelfth horizontal sensing wiring (not shown) may be disposed on the other side (for example, right side) of the first auxiliary voltage wiring DML2.

In this case, the auxiliary voltage wiring 760_2 disposed between the first and second horizontal sensing wirings 311 and 312 may include a transverse portion 763. The transverse portion 763 of the auxiliary voltage wiring 760_2 may extend in the horizontal direction (or left and right directions) with respect to the body 761, and may overlap the first and second horizontal sensing wires 311 and 312.

Therefore, the pixels connected to the ends of the first and second horizontal sensing wirings 311 and 312 may have substantially the same characteristics as the pixels connected to the other portions of the first and second horizontal sensing wirings 311 and 312.

Referring to FIGS. 10, 11, and 15, an auxiliary voltage wiring 760_3 is different from the auxiliary voltage wiring 760 of FIG. 11 in that the auxiliary voltage wiring 760_3 has a width changing along the row direction.

In a region where the auxiliary voltage wiring 760_3 overlaps the horizontal sensing wiring 310, the first width W1 of the auxiliary voltage wiring 760_3 may be greater than the average width of the auxiliary voltage wiring 760_3. Further, the first width W1 of the auxiliary voltage wiring 760_3 may be equal to or greater than the width of the protrusion 651 of the sensing wiring 650. Accordingly, the auxiliary voltage wiring 760_3 may completely cover the third data pattern 630. In this case, since the cross-sectional area of the auxiliary voltage wiring 760_3 partially increases, the resistance value of the auxiliary voltage wiring 760_3 may decrease. When the auxiliary voltage wiring 760_3 is connected to the first power source voltage wiring, the voltage drop of the first power source voltage ELVDD may be further reduced.

Meanwhile, referring to FIG. 15, the sensing wiring 650_3 may have substantially the same shape as the auxiliary voltage wiring 760_3. That is, the fourth width W4 of the sensing wiring 650_3 in the first overlap region, the fifth width W5 of the sensing wiring 650_3 in the second overlap region, and the sixth width W6 of the sensing wiring 650_3 in the third overlap region may be equal to the first to third widths T1, T2, and T3 of the auxiliary voltage wiring 760_3, respectively.

Figure 16:
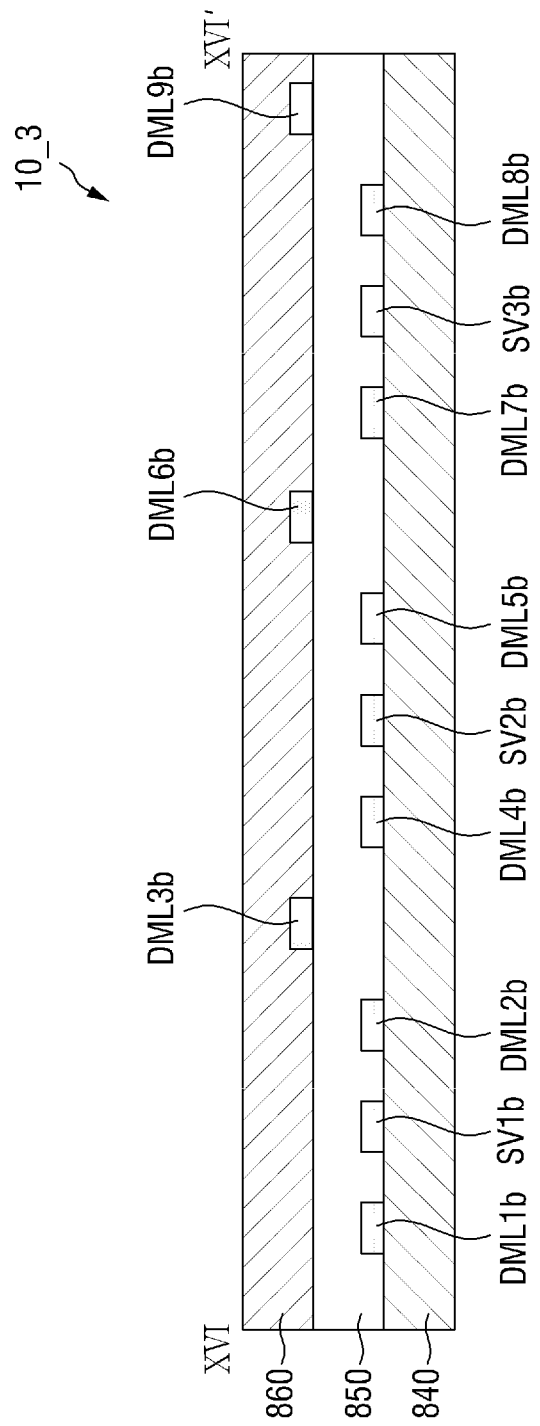
FIG. 16 is a cross-sectional view showing another example of the display unit included in the display device of FIG. 1.

FIG. 16 is a cross-sectional view showing another example of the display unit included in the display device of FIG. 1. FIG. 16 may correspond to a cross-sectional view taken along line XVI-XVI' in FIG. 2A.

Referring to FIGS. 1, 2A, and 16, a display unit 10_3 is different from the display unit 10 of FIG. 2A in that display unit 10_3 includes auxiliary voltage wirings DML1b to DML9b and vertical sensing wirings SV1b to SV3b.

The auxiliary voltage wirings DML1b to DML9b may be substantially the same as the auxiliary voltage wirings DML1 to DML9 having been described with reference to FIGS. 1 and 2A, except for a layer in which these auxiliary voltage wirings DML1b to DML9b are to be formed. The vertical sensing wirings SV1b to SV3b may be substantially the same as the vertical sensing wirings SV1 to SV3 having been described with reference to FIGS. 1 and 2A. Therefore, redundant descriptions will not be repeated.

As shown in FIG. 16, the first, second, fourth, fifth, seventh and eighth auxiliary voltage wirings DML1b, DML2b, DML4b, DML5b, DML7b and DML8b may be formed in the fourth conductive layer 600, and the third, sixth, and ninth auxiliary voltage wirings DML3b, DML6b and DML9b may be formed in the fifth conductive layer 700. That is, auxiliary voltage wirings intersecting (or overlapping) the horizontal sensing wirings shown in FIG. 2 may be formed in the fourth conductive layer 600, and auxiliary voltage wirings not intersecting (or not overlapping) the horizontal sensing wirings shown in FIG. 2 may be formed in the fifth conductive layer 700.

In this case, the third, sixth, and ninth auxiliary voltage wirings DML3b, DML6b, and DML9b may be substantially the same as the auxiliary voltage wiring 760_2 shown in FIG. 14. That is, the third, sixth, and ninth auxiliary voltage wirings DML3b, DML6b, and DML9b include the horizontal portion 763, and may overlap the horizontal sensing wirings through the horizontal portion 763.

Therefore, the pixels connected to the ends of the first and second horizontal sensing wirings 311 and 312 may have substantially the same characteristics as the pixels connected to the other portions of the first and second horizontal sensing wirings 311 and 312.

Figure 17:
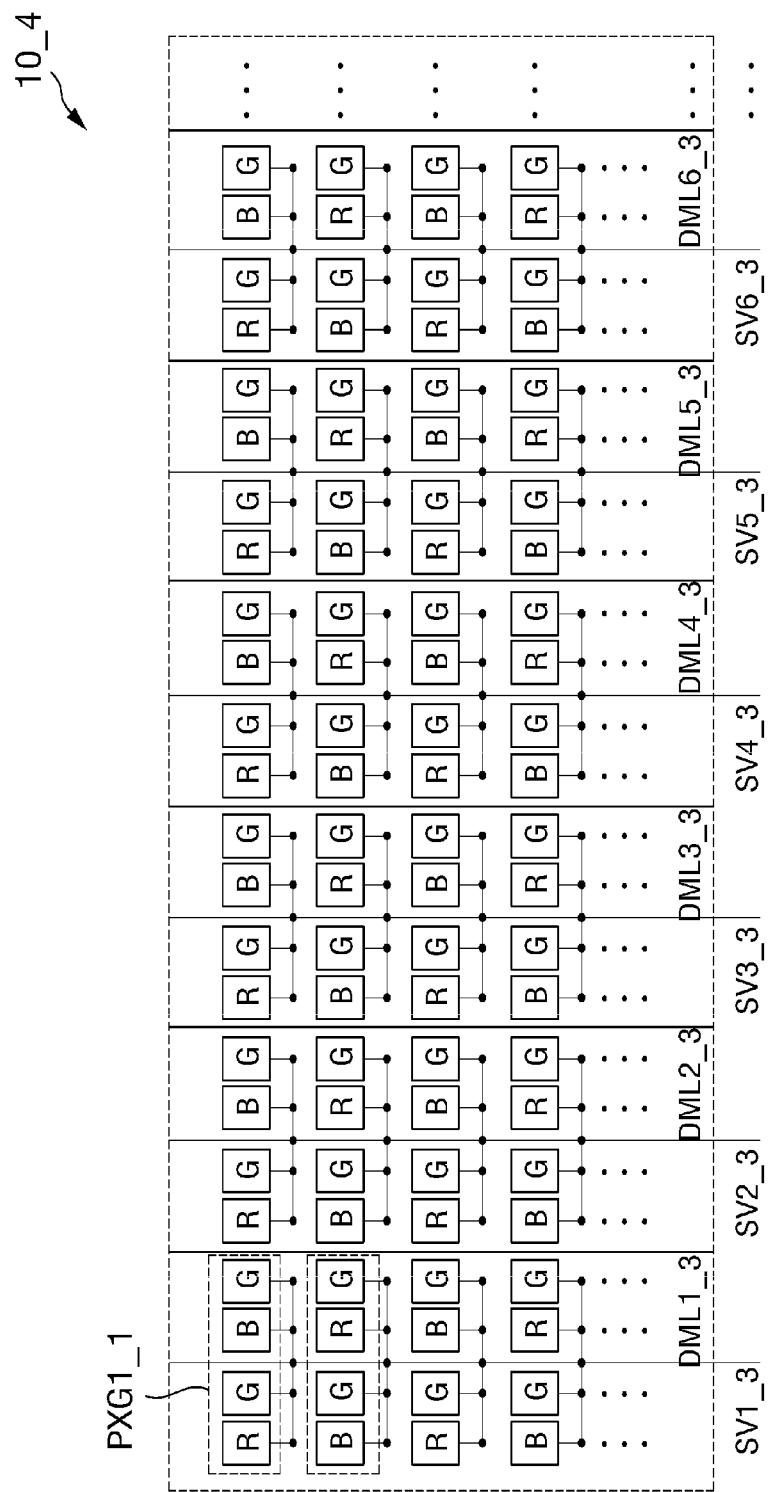
FIG. 17 is a circuit diagram showing still another example of the display unit included in the display device of FIG. 1.

FIG. 17 is a circuit diagram showing still another example of the display unit included in the display device of FIG. 1.

Referring to FIGS. 1, 2A, and 17, a display unit 10_4 is different from the display unit 10 of FIG. 2A in that the display unit 10_3 includes vertical sensing wirings SV1_3 to SV6_3 and auxiliary voltage wirings DML1_3 to DML6_3.

The vertical sensing wirings SV1_3 to SV6_3 are similar to the vertical sensing wirings SV1 to SV3 of FIG. 2A, but may be disposed to be spaced apart from each other at intervals corresponding to four pixels. Meanwhile, the auxiliary voltage wirings DML1_3 to DML6_3 are disposed between the vertical sensing wirings SV1_3 to SV6_3, and may be disposed to be spaced apart from each other at intervals corresponding to four pixels. That is, the vertical sensing wirings SV1_3 to SV6_3 and the auxiliary voltage wirings DML1_3 to DML6_3 may be alternately arranged along the row direction with intervals corresponding to the two pixels.

Meanwhile, the vertical sensing wirings SV1_3 to SV6_3 may be connected to four pixels in one row, and for this purpose, the horizontal sensing wirings may extend in the row direction at lengths corresponding to four pixels.

Figure 18:
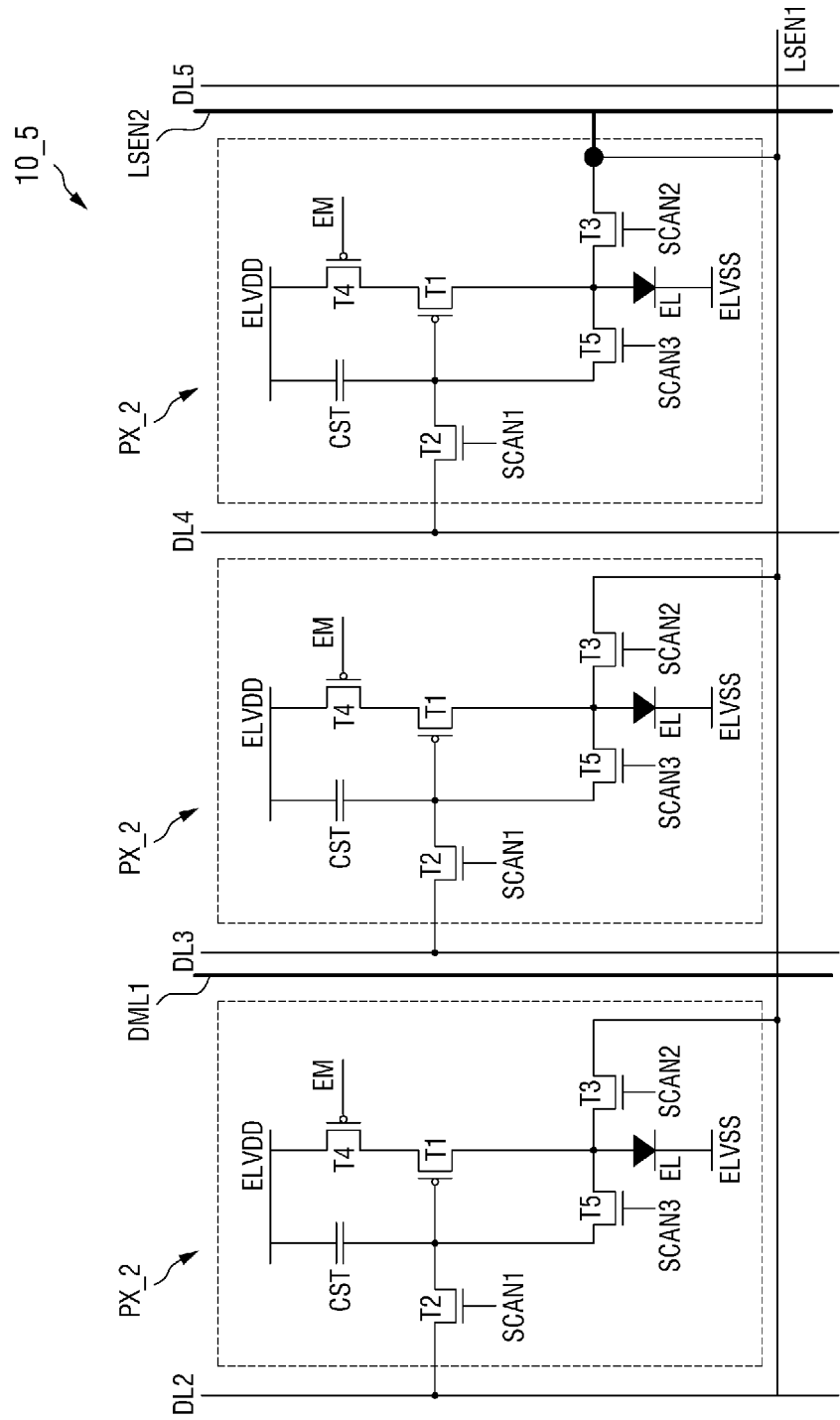
FIGS. 18 and 19 are circuit diagrams showing various embodiments of the display unit in the display device of FIG. 1.
Figure 19:
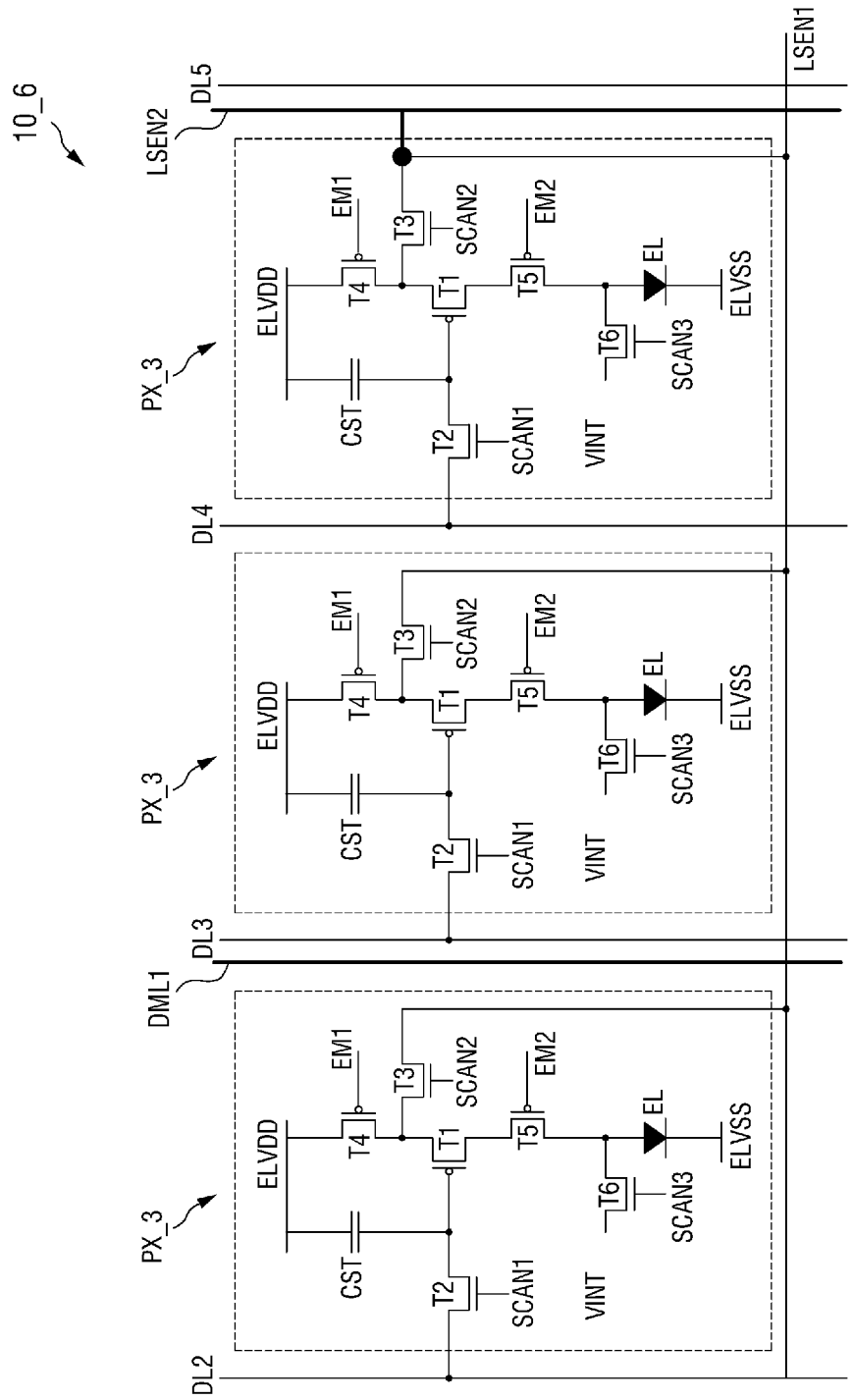

FIGS. 18 and 19 are circuit diagrams showing various embodiments of the display unit in the display device of FIG. 1. FIGS. 18 and 19 are circuit diagrams corresponding to FIG. 3.

Referring to FIGS. 3 and 18, a display unit 10_5 is different from the display unit 10 of FIG. 3 in that the display unit 10_5 further includes a pixel PX_2 further including a fifth transistor T5. The pixel PX_2 may be substantially the same as or similar to the pixel PX having been described with reference to FIG. 3, except for the fifth transistor T5.

The fifth transistor T5, similarly to the second and third transistors T2 and T3, may include an oxide semiconductor.

The fifth transistor T5 may include a first electrode connected to the gate electrode of the first transistor T1, a second electrode connected to the second electrode of the first transistor T1 (or anode of the light emitting element EL), and a gate electrode receiving a third scan signal SCAN3. Here, the third scan signal SCAN3 may have a waveform substantially the same as or similar to that of the first scan signal SCAN1.

The fifth transistor T5 may be turned on in response to the third scan signal SCAN3, and may be used to compensate for the threshold voltage of the first transistor T1.

Referring to FIGS. 3 and 19, a display unit 10_6 is different from the display unit 10 of FIG. 3 in that the display unit 10_6 includes a pixel PX_3.

The pixel PX_3 may include a light emitting element EL, first to sixth transistors T1 to T6, and a storage capacitor CST. That is, the pixel PX_3 may have a structure of 6T1C.

The first, second, and fourth transistors T1, T2 and T4 and the storage capacitor CST may be substantially the same as the first, second, and fourth transistors T1, T2 and T4 and the storage capacitor CST, which have been described with reference to FIG. 3. Therefore, redundant descriptions will not be repeated.

The third and sixth transistors T3 and T6, similarly to the first transistor T1, may include a polycrystalline silicon semiconductor, and may be top gate type transistors. The fifth transistor T5, similarly to the second and third transistors T1 and T3, may include an oxide semiconductor, and may be a top gate type transistor.

The third transistor T3 may include a first electrode connected to the first electrode of the first transistor T1, a second electrode connected to the horizontal sensing wiring LESN1, and a gate electrode receiving a second scan signal SCAN2. The third transistor T3 may be turned on in response to the second scan signal SCAN2, and in this case, the sensing unit 50 may measure the characteristics of the pixel PX.

The fifth transistor T5 may include a first electrode connected to the second electrode of the first transistor T1, a second electrode connected to the anode of the light emitting element EL, and a gate electrode receiving a second light emission control signal EM2. The fifth transistor T5, similarly to the fourth transistor T4, may be turned on in response to the second light emission control signal EM2, and a driving current Id may be provided to the light emitting element EL.

The sixth transistor T6 may include a first electrode connected to the anode electrode of the light emitting element EL, a second electrode receiving an initialization voltage VINT, and a gate electrode connected to the third scan signal SCAN3. The sixth transistor T6 may be turned on in response to the third scan signal SCAN3 before or after the light emitting element EL emits light, and the anode electrode (or parasitic capacitor) of the light emitting element EL may be initialized by the initialization voltage VINT.

The initialization voltage VINT may be generated and provided from the power supply unit (or an external voltage) having been described with reference to FIG. 1. In this case, the auxiliary voltage VAUX applied to the auxiliary voltage wirings DL2 to DL4 may be equal to the initialization voltage VINT.

As described above with reference to FIGS. 18 and 19, the display units 10_5 and 10_6 may include the pixels PX__2 and PX__3 having a structure of 5TIC or 6TIC in addition to 4TIC. Even in this case, the vertical sensing wirings may be spaced apart from each other in the row direction with specific intervals (for example, intervals corresponding to eight pixels), and the auxiliary voltage wirings may be spaced apart from each other in the row direction with specific intervals (for example, intervals corresponding to two pixels) between the vertical sensing wirings. Therefore, the pixels arranged in the display units 10_5 and 10_6 have similar characteristics regardless of the distance from the vertical sensing wiring LSEN2, and the deterioration of display quality can be prevented.

As described above, according to the display device of an embodiment, a difference in characteristics between pixels due to a sensing wiring can be eliminated by an auxiliary voltage wiring simulating the sensing wiring.

The effects of the present inventive concept are not limited by the foregoing, and other various effects are anticipated herein.

Although the preferred embodiments of the present inventive concept have been disclosed for illustrative purposes, those skilled in the art will appreciate that various modifications, additions and substitutions are possible, without departing from the scope and spirit of the inventive concept as disclosed in the accompanying claims.

What is claimed is:

1. A display device, comprising:
   a plurality of pixels;
   a plurality of sensing wirings extending in a first direction and arranged in a second direction perpendicular to the first direction;
   a plurality of auxiliary wirings extending in the first direction and arranged in the second direction; and
   a sensing driver electrically connected to the plurality of sensing wirings,
   wherein an auxiliary voltage is applied to the plurality of auxiliary wirings, and
   wherein a shape of one of the plurality of sensing wirings is substantially same as a shape of one of the plurality of auxiliary wirings in a plan view.

2. The display device of claim 1, wherein the plurality of sensing wirings is disposed on a different layer from the plurality of auxiliary wirings.

3. The display device of claim 1, wherein the plurality of sensing wirings and the plurality of auxiliary wirings are alternately arranged in the second direction.

4. The display device of claim 1, further comprising a plurality of data lines extending in the first direction and arranged in the second direction.

5. The display device of claim 1, further comprising a power supply voltage line disposed on a same layer as the plurality of auxiliary wirings.

6. The display device of claim 5, wherein the power supply voltage line receives a power supply voltage, and
   wherein the auxiliary voltage is substantially the same as the power supply voltage.

7. The display device of claim 5, wherein the power supply voltage line receives a power supply voltage, and
   wherein the auxiliary voltage is different from the power supply voltage.

8. The display device of claim 5, wherein the power supply voltage line includes a first power supply voltage line extending in the first direction and a second power supply voltage line extending in the second direction.

9. The display device of claim 1, wherein one of the plurality of sensing wirings includes a first body extending in the first direction and a first protrusion protruding from the first body in the second direction.

10. The display device of claim 9, wherein one of the plurality of auxiliary wirings includes a second body extending in the first direction and a second protrusion protruding from the second body in the second direction.

11. The display device of claim 10, wherein the first protrusion is connected to an electrode of a transistor in a pixel among the plurality of pixels.

12. The display device of claim 10, wherein the second protrusion overlaps an electrode of a transistor in a pixel among the plurality of pixels.

13. A display device, comprising:
   a plurality of pixels;
   a plurality of sensing wirings including a body extending in a first direction and a protrusion protruding from the body in a second direction perpendicular to the first direction;
   a plurality of auxiliary wirings extending in the first direction and arranged in the second direction; and
   a conductive pattern disposed on a different layer from the plurality of auxiliary wirings,
   wherein a shape of the conductive pattern is substantially the same as a shape of the protrusion in a plan view.

14. The display device of claim 13, further comprising a sensing driver electrically connected to the plurality of sensing wirings, and
   wherein an auxiliary voltage is applied to the plurality of auxiliary wirings.

15. The display device of claim 13, wherein the conductive pattern is electrically connected to one of the plurality of auxiliary wirings.

16. The display device of claim 13, further comprising a plurality of data lines extending in the first direction and arranged in the second direction, wherein the conductive pattern is electrically connected to one of the plurality of data lines.

17. The display device of claim 13, wherein the plurality of sensing wirings is disposed on a same layer as the plurality of auxiliary wirings.

18. The display device of claim 13, further comprising a power supply voltage line disposed on a same layer as the conductive pattern.

19. The display device of claim 13, wherein the plurality of sensing wirings and the plurality of auxiliary wirings are alternately arranged in the second direction.

20. The display device of claim 13, wherein the conductive pattern overlaps one of the plurality of auxiliary wirings.

* * * * *